US011469743B1

(12) United States Patent
Xian et al.

(10) Patent No.: US 11,469,743 B1
(45) Date of Patent: Oct. 11, 2022

(54) TIMING CIRCUIT ARRANGEMENTS FOR FLIP-FLOPS

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Qingchao Meng, Hsinchu (TW); Yang Zhou, Hsinchu (TW); Shang-Chih Hsieh, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 17/244,123

(22) Filed: Apr. 29, 2021

(30) Foreign Application Priority Data

Apr. 6, 2021 (CN) .......................... 202110367122.4

(51) Int. Cl.
| H03K 3/00 | (2006.01) |
| H03K 3/037 | (2006.01) |
| H03K 3/3562 | (2006.01) |
| H03K 3/289 | (2006.01) |
| H03K 3/356 | (2006.01) |
| H03K 3/288 | (2006.01) |

(52) U.S. Cl.
CPC ........... *H03K 3/0372* (2013.01); *H03K 3/288* (2013.01); *H03K 3/289* (2013.01); *H03K 3/3562* (2013.01); *H03K 3/35625* (2013.01); *H03K 3/356017* (2013.01); *H03K 3/356104* (2013.01); *H03K 3/356113* (2013.01); *H03K 3/356147* (2013.01)

(58) Field of Classification Search
None
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |
| 2012/0133407 A1* | 5/2012 | Yokoyama ....... H03K 3/356156 327/218 |
| 2013/0002298 A1 | 1/2013 | Howard et al. |
| 2014/0040838 A1 | 2/2014 | Liu et al. |
| 2014/0368246 A1* | 12/2014 | Kim .................... H03K 3/0375 327/202 |

(Continued)

FOREIGN PATENT DOCUMENTS

EP 0851581 A2 * 7/1998 ........... H03K 3/0372

*Primary Examiner* — Tuan T Lam
(74) *Attorney, Agent, or Firm* — Hauptman Ham, LLP

(57) ABSTRACT

An integrated circuit includes a first time delay circuit, a second time delay circuit, and a master-slave flip-flop having a gated input circuit and a transmission gate. The first time delay circuit has a first input configured to receive a first clock signal and having a first output configured to generate a second clock signal. The second time delay circuit has a second input configured to receive the second clock signal and having a second output configured to generate a third clock signal. The transmission gate is configured to receive the first clock signal and the second clock signal to control a transmission state of the transmission gate. The gated input circuit is configured to have an input transmission state controlled by the third clock signal at the second output of the second time delay circuit.

20 Claims, 27 Drawing Sheets

(56) References Cited

U.S. PATENT DOCUMENTS

| | | | |
|---|---|---|---|
| 2015/0102847 A1* | 4/2015 | Singh | H03K 3/0372 |
| | | | 327/203 |
| 2015/0154924 A1* | 6/2015 | Yokoyama | H03K 3/356156 |
| | | | 345/204 |
| 2015/0200651 A1* | 7/2015 | Baratam | H03K 3/012 |
| | | | 327/202 |
| 2015/0278429 A1 | 10/2015 | Chang | |
| 2015/0349756 A1* | 12/2015 | Kim | H03K 3/0372 |
| | | | 327/202 |
| 2015/0381154 A1* | 12/2015 | Maeno | H03K 3/35625 |
| | | | 327/203 |
| 2016/0146887 A1* | 5/2016 | Lou | G01R 31/318552 |
| | | | 714/731 |
| 2017/0141766 A1* | 5/2017 | Kao | H03K 3/35625 |
| 2017/0270876 A1* | 9/2017 | Yokoyama | H03K 3/356156 |
| 2017/0317666 A1* | 11/2017 | Liu | G01R 31/318541 |

\* cited by examiner

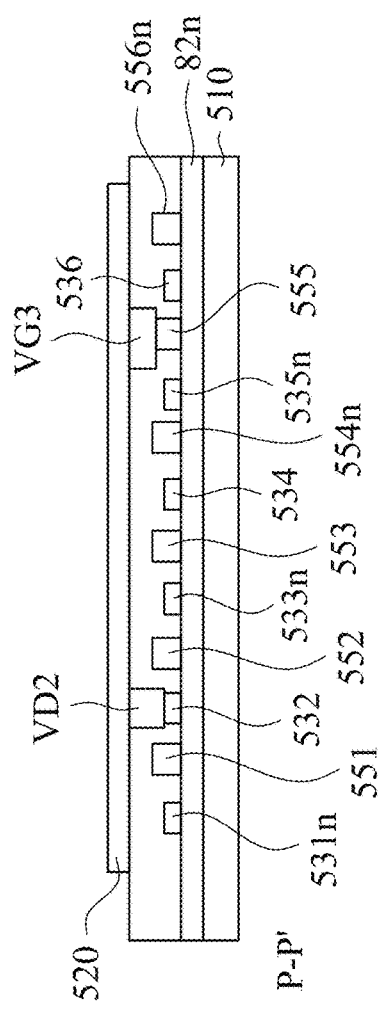
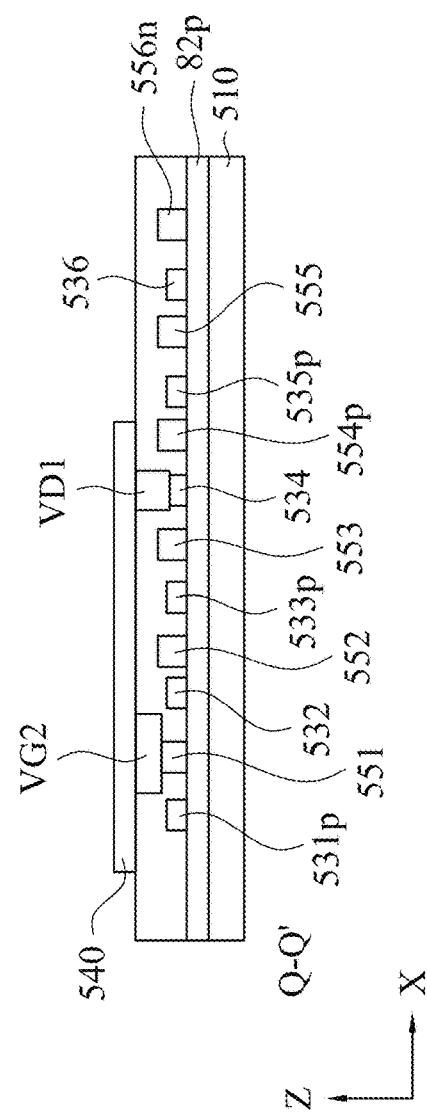
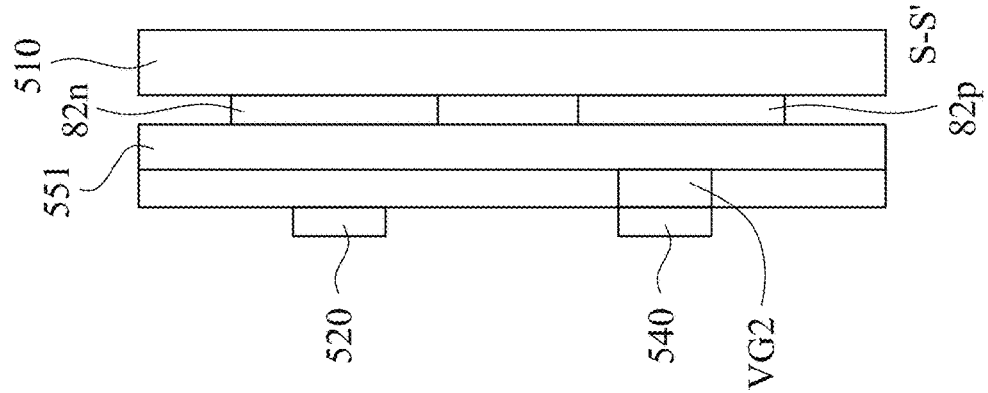
FIG. 5C
FIG. 5D
FIG. 5B

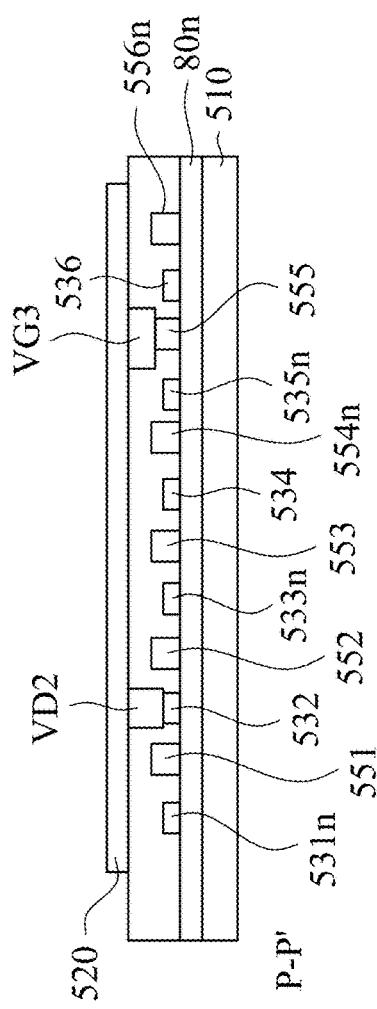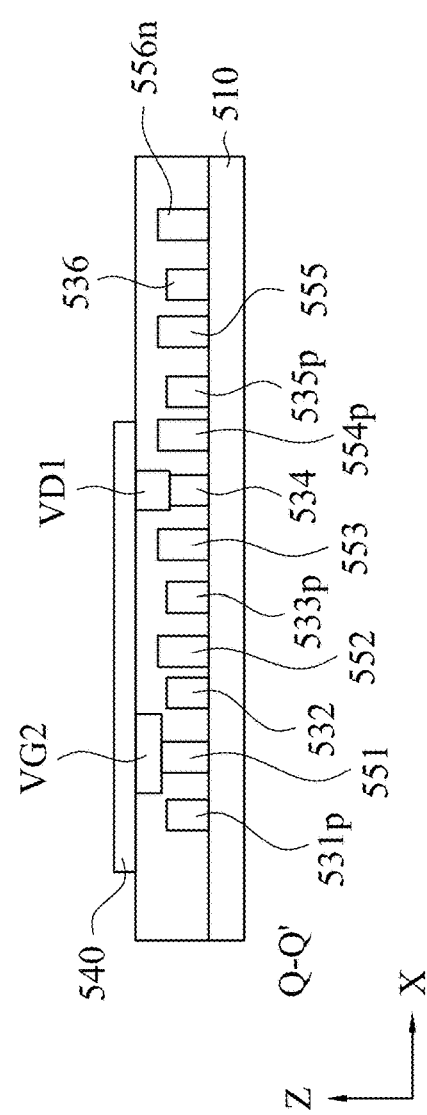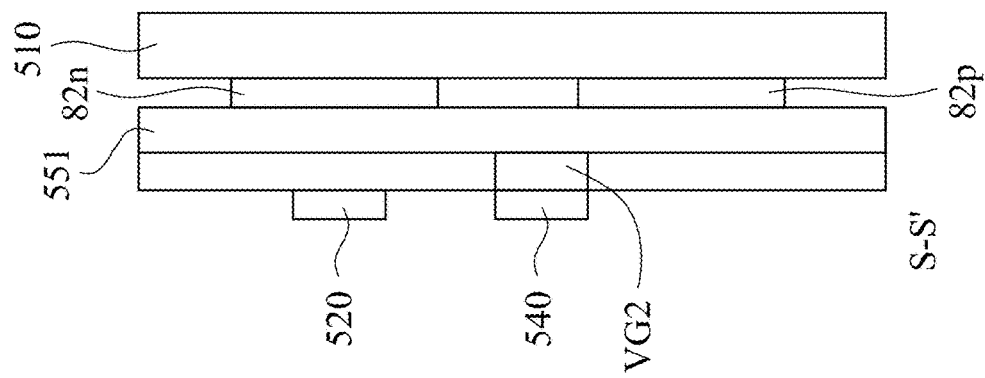
FIG. 6C
FIG. 6D
FIG. 6B

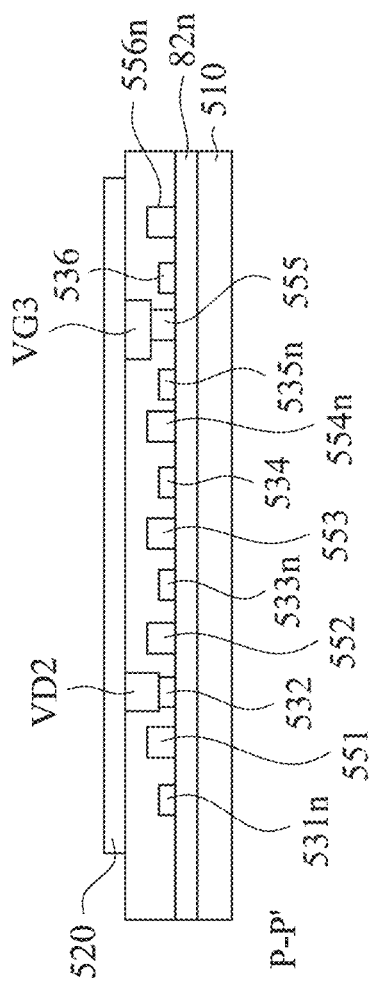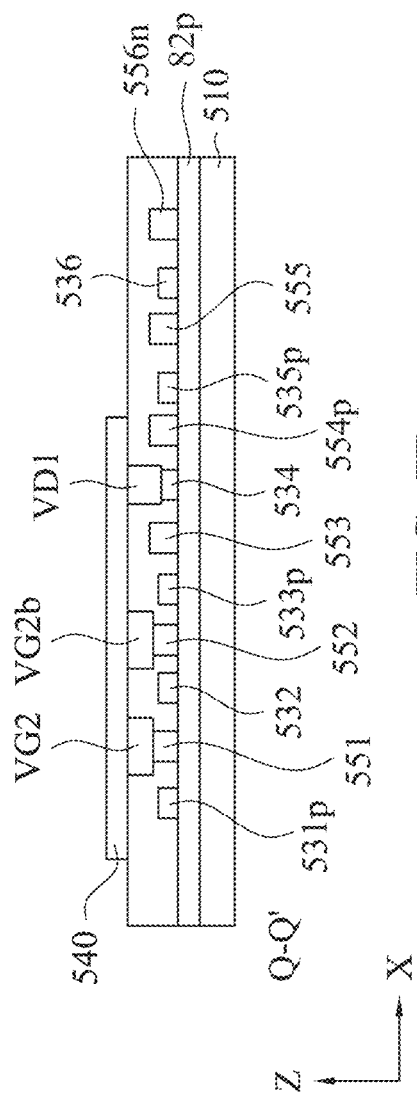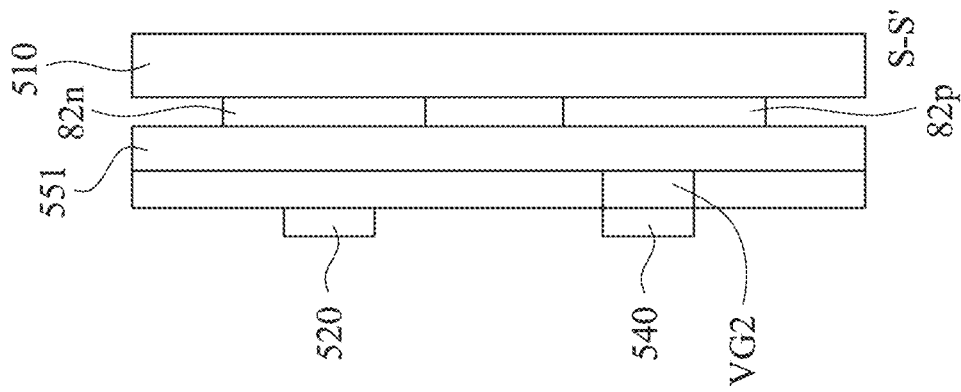

TIMING CIRCUIT ARRANGEMENTS FOR FLIP-FLOPS

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B-5D are cross-sectional views of the timing circuit as specified by the layout diagram in FIG. 5A, in accordance with some embodiments.

FIGS. 6B-6D are cross-sectional views of the timing circuit as specified by the layout diagram in FIG. 6A, in accordance with some embodiments.

FIGS. 7B-7D are cross-sectional views of the timing circuit as specified by the layout diagram in FIG. 7A, in accordance with some embodiments.

DETAILED DESCRIPTION

Figure 1A:
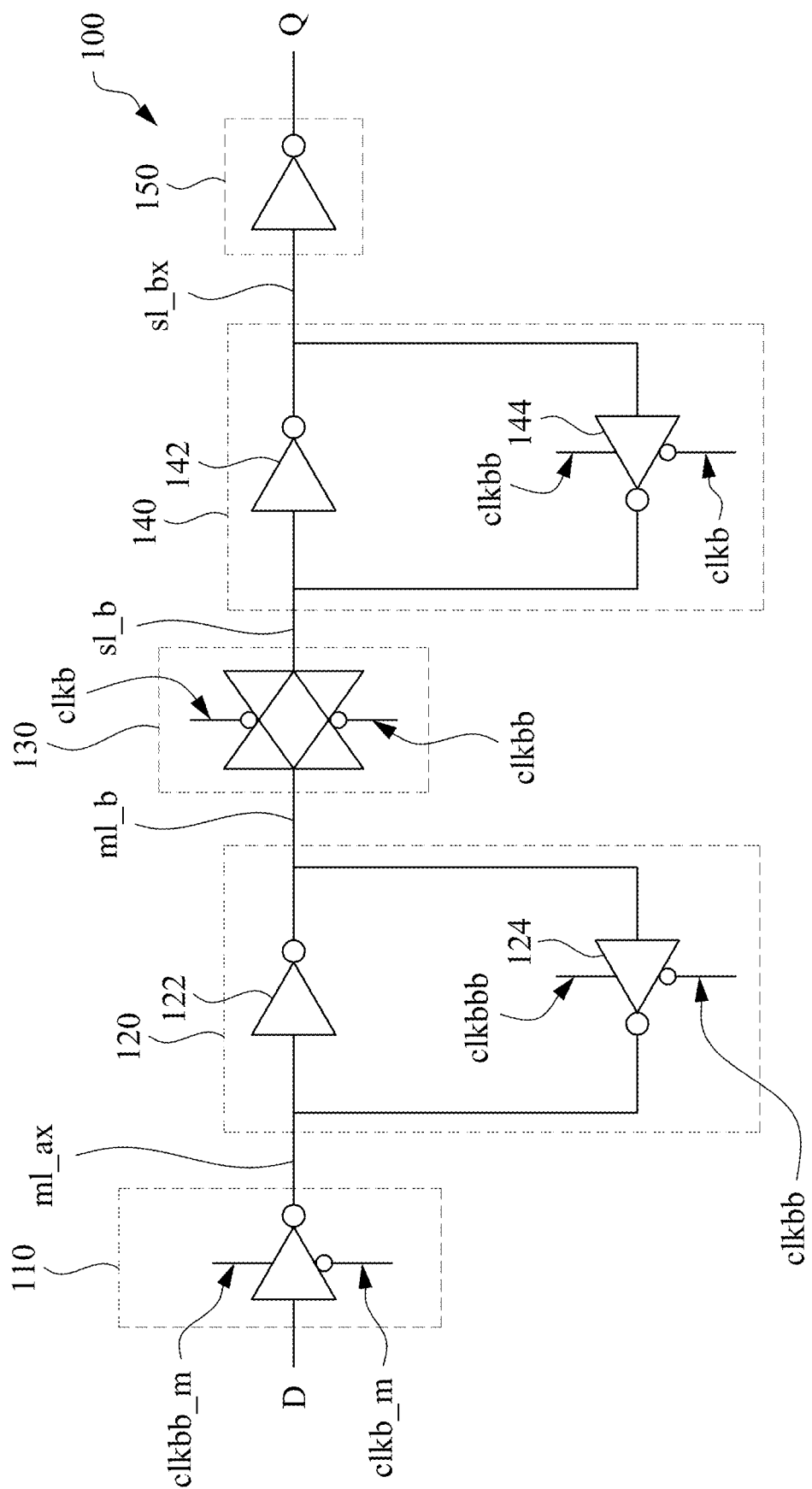
FIGS. 1A-1B are circuit diagrams of a master-slave flip-flop and a timing circuit for generating the clock signals for the master-slave flip-flop, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A master-slave flip-flop includes a gated input circuit, a master latch, a slave latch, and a transmission gate coupled between the master latch and the slave latch. The master latch is coupled between the gated input circuit and the transmission gate. In some embodiments, a modified timing circuit for controlling the master-slave flip-flop improves the reliability of the operation sequences that the transmission gate is opened before the gated input circuit is changed to the connected state. In some embodiments, the modified timing circuit includes a first time delay circuit and a second time delay circuit. The first time delay circuit has an output coupled to an input of the second time delay circuit. A clock signal at the output of the first time delay circuit is coupled to the transmission gate, and a clock signal at the output of the second time delay circuit is coupled to the gated input circuit. In some embodiments, at least a portion of a first gate-conductor in a time delay circuit is atop a structure having active regions.

Figure 1B:
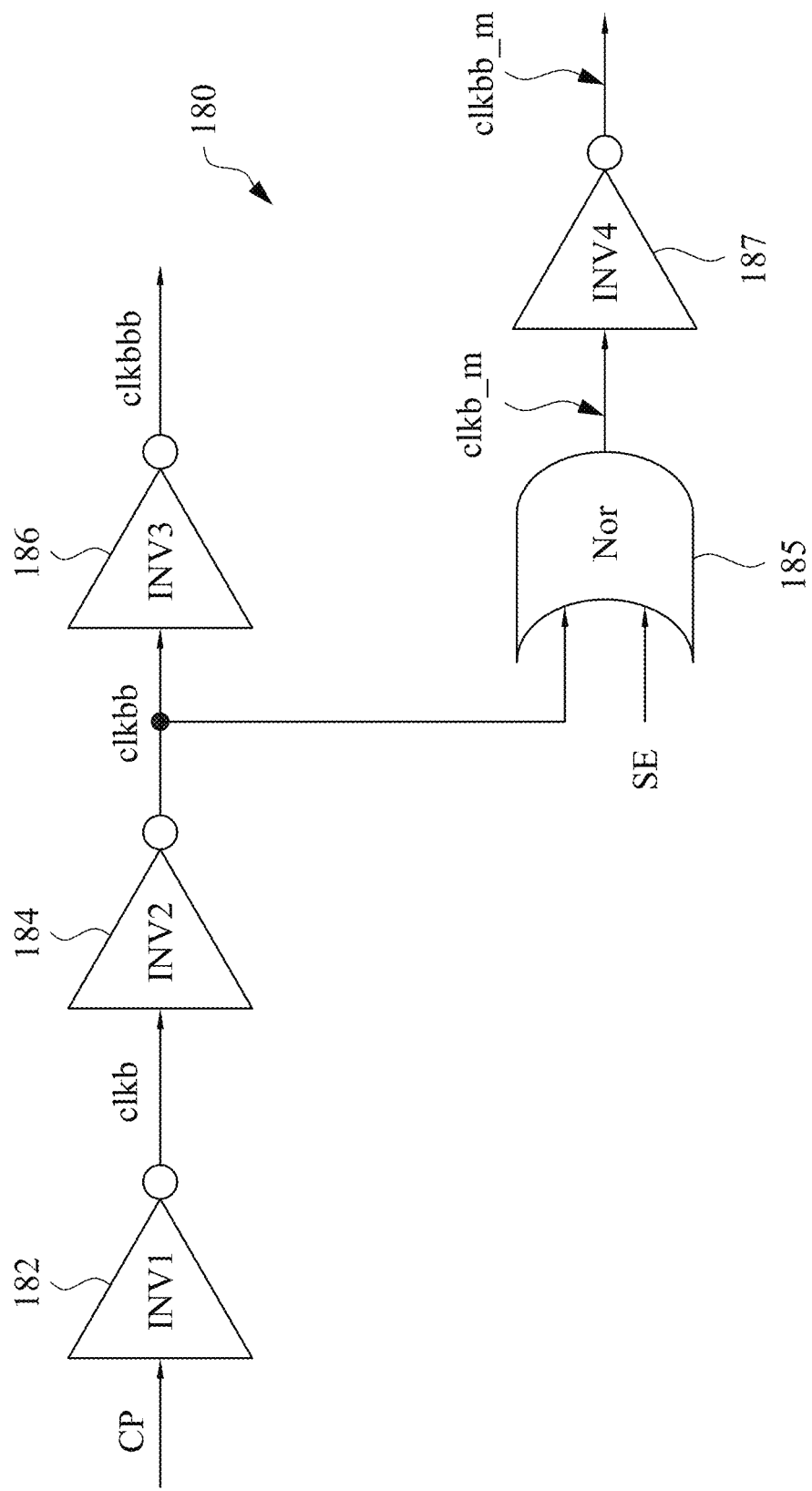
Figure 2:
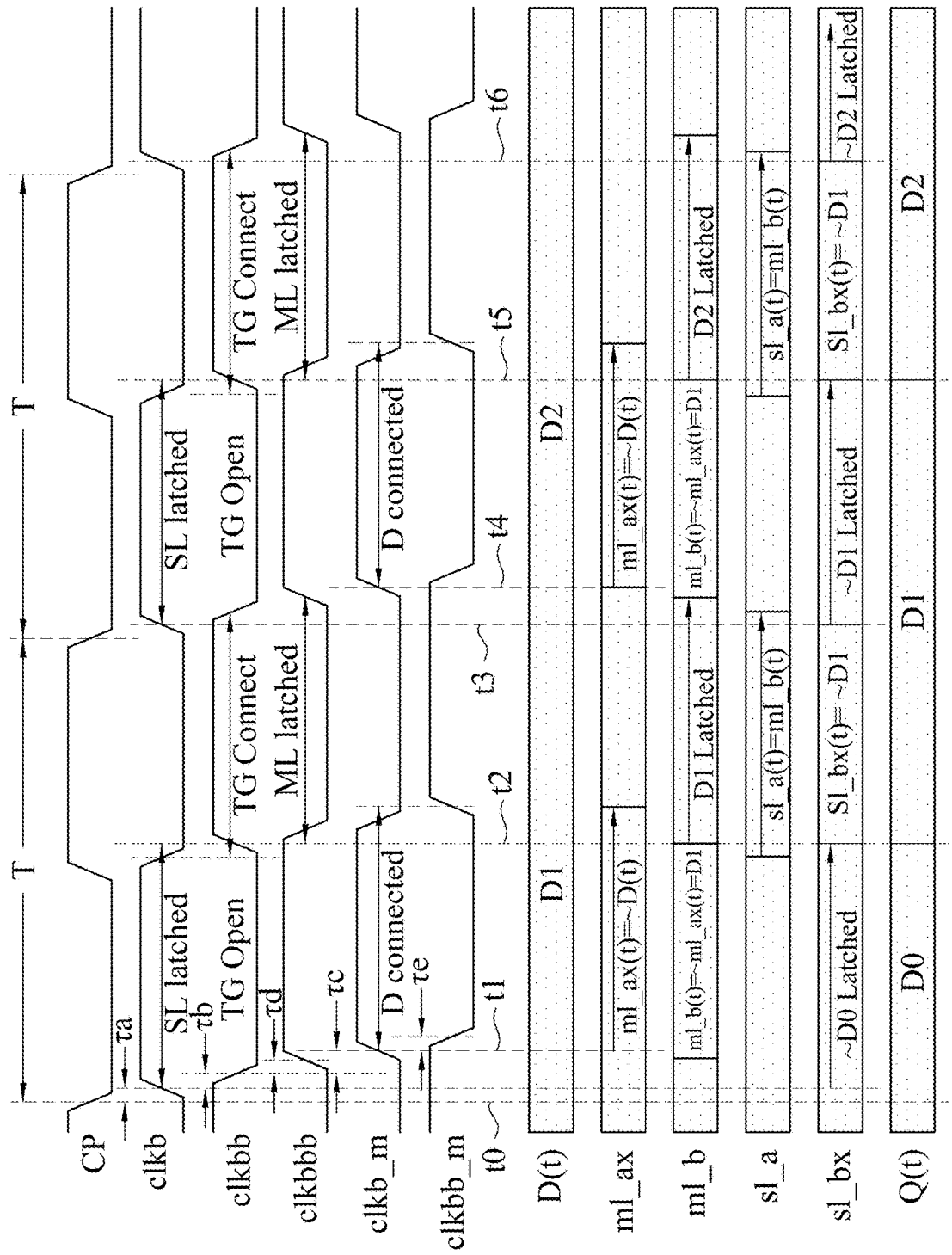
FIG. 2 is a timing diagram of various clock signals in the timing circuit and various data signals in the master-slave flip-flop, in accordance with some embodiments.

FIGS. 1A-1B are circuit diagrams of a master-slave flip-flop 100 and a timing circuit 180 for generating the clock signals for the master-slave flip-flop 100, in accordance with some embodiments. In FIG. 1B, the timing circuit 180 includes time delay circuits 182, 184, 186, 185, and 187. The timing circuit 180 receives a base clock signal CP, and generates various time delayed clock signals clkb, clkbb, clkbbb, clkb_m, and clkbb_m which are coupled to the master-slave flip-flop 100 to control the operation of various components in the master-slave flip-flop 100. FIG. 2 is a timing diagram of various clock signals in the timing circuit 180 and various data signals in the master-slave flip-flop 100, in accordance with some embodiments.

In FIG. 1B, the base clock signal CP is received at the input of the time delay circuit 182, and the inversion of the base clock signal CP with some time delay is generated as the first clock signal clkb at the output of the time delay circuit 182. Because the first clock signal clkb is the inverse of the base clock signal CP, as shown in FIG. 2, when the base clock signal CP changes from the logic LOW to the logic HIGH, the first clock signal clkb correspondingly changes from the logic HIGH to the logic LOW. The falling edge of the first clock signal clkb follows the rising edge of the base clock signal CP with some time delay. Similarly, as shown in FIG. 2, when the base clock signal CP changes from the logic HIGH to the logic LOW, the first clock signal clkb correspondingly changes from the logic LOW to the logic HIGH. The rising edge of the first clock signal clkb follows the falling edge of the base clock signal CP also with some time delay.

In FIG. 1B, the first clock signal clkb at the output of the time delay circuit 182 is received at the input of the time delay circuit 184, and the inverse of the first clock signal clkb with some time delay is generated as the second clock signal clkbb at the output of the time delay circuit 184. The time delay circuit 185 receives the second clock signal clkbb at one input and receives the scan enabling signal SE at another input. If the scan enabling signal SE is set as the logic LOW, the inverse of the second clock signal clkbb with some time delay is generated as the third clock signal clkb_m at the output of the time delay circuit 185. The output signal of the time delay circuit 185 is coupled to the input of the time delay circuit 187, and the inverse of the third clock signal clkb_m is generated as clock signal clkbb_m at the output of the time delay circuit 187. Additionally, in FIG. 1B, the second clock signal clkbb is also received by the time delay circuit 186, and the inverse of the second clock signal clkbb is generated as clock signal clkbbb at the output of the time delay circuit 186.

In the timing diagram of FIG. 2, the base clock signal CP has a time period T with 50% duty cycle, and one of the falling edges of the base clock signal CP is at time t0 as identified in the figure. The first clock signal clkb is delayed from the base clock signal CP by a time delay τa and has a rising edge at time t0+τa. In addition, the second clock signal clkbb is delayed from the first clock signal clkb by a time delay τb, and the clock signal clkbbb is delayed from the second clock signal clkbb by a time delay τd. One of the falling edges of the second clock signal clkbb is at time t0+τa+τb, and one of the rising edges of the clock signal clkbbb is at time t0+τa+τb+τd. Furthermore, the third clock signal clkb_m is delayed from the second clock signal clkbb by a time delay τc, and the clock signal clkbb_m is delayed from the third clock signal clkb_m by a time delay τe. One of the rising edges of the third clock signal clkb_m is at time t0+τa+τb+τc, and one of the falling edges of the clock signal clkbb_m is at time t0+τa+τb+τc+τe.

In some embodiments, each of the time delay circuits 182, 184, 186, and 187 is implemented as an inverter gate, and the time delay circuit 185 is implemented as a NOR gate. Other implementations of the time delay circuits are within the contemplated scope of the present disclosure. For example, in some alternative embodiments, one or more of the time delay circuits 182, 184, 186, and 187 are implemented as three serially connected inverter gates. In some alternative embodiments, the time delay circuit 185 is implemented as one NOR gate coupled with two serially connected inverter gates.

In FIG. 1A, the master-slave flip-flop 100 includes a gated input circuit 110, a master latch 120, a transmission gate 130, a slave latch 140, and an inverter 150. The gated input circuit 110 receives an input data D at the input terminal of the master-slave flip-flop 100 and receives the clock signals clkb_m and clkbb_m from the timing circuit 180. The master latch 120, which is coupled between the gated input circuit 110 and the transmission gate 130, receives the clock signals clkbb and clkbbb from the timing circuit 180. The transmission gate 130, which is coupled between the master latch 120 and the slave latch 140, receives the clock signals clkbb and clkb from the timing circuit 180. The slave latch 140, which is coupled between the transmission gate 130 and the inverter 150, receives the clock signals clkb and clkbb from the timing circuit 180.

In FIG. 1A, the gated input circuit 110 is implemented as a clocked inverter. The input transmission state of the gated input circuit 110 is controlled by the clock signals clkb_m and clkbb_m received from the timing circuit 180. When the third clock signal clkb_m is at the logic HIGH and/or the clock signal clkbb_m is at the logic LOW, the input transmission state of the gated input circuit 110 is set to the connected state, and the inverse of the input data D is generated at the output of the gated input circuit 110 which is coupled to the input node ml_ax of the master latch 120. In the timing diagram of FIG. 2, the input transmission state of the gated input circuit 110 is driven to the connected state during one time interval from time t1=t0+τa+τb+τc to time t0+τa+τb+τc+τe+T/2 and during another time interval from time t4=t0+τa+τb+τc+T to time t0+τa+τb+τc+τe+3T/2.

In FIG. 1A, the master latch 120 includes an inverter 122 and a clocked inverter 124 driven by the clock signals clkbb and clkbbb. When the second clock signal clkbb is at the logic LOW and the clock signal clkbbb is at the logic HIGH, the master latch 120 is at the unlatched state, the output signal of the clocked inverter 124 is the inverse of the input signal of the clocked inverter 124. When the second clock signal clkbb is at the logic HIGH and/or the clock signal clkbbb is at the logic LOW, the master latch 120 is at the latched state, and the signal at the output node ml_b is latched in the master latch 120. In the timing diagram of FIG. 2, the master latch 120 is latched during one time interval from time t2=t0+τa+τb+T/2 to time t0+τa+τb+τd+T and during another time interval from time t5=t0+τa+τb+3T/2 to time t0+τa+τb+τd+2T.

In FIG. 1A, the transmission gate 130 is controlled by the second clock signal clkbb and the first clock signal clkb received from the timing circuit 180. When the second clock signal clkbb is at the logic HIGH and/or the first clock signal clkb is at the logic LOW, the transmission state of the transmission gate 130 is set to the connected state, and the input node sl_a of the slave latch 140 is conductively connected to the output node ml_b of the master latch 120. In the timing diagram of FIG. 2, the transmission state of the transmission gate 130 is driven to the connected state during one time interval from time t0+τa+T/2 to time t0+τa+τb+T and during another time interval from time t0+τa+3T/2 to time t0+τa+τb+2T.

In FIG. 1A, the slave latch 140 includes an inverter 142 and a clocked inverter 144 driven by the clock signals clkb and clkbb. When the first clock signal clkb is at the logic LOW and the second clock signal clkbb is at the logic HIGH, the slave latch 140 is at the unlatched state, and the output signal of the clocked inverter 144 is the inverse of the input signal of the clocked inverter 144. When the first clock signal clkb is at the logic HIGH and/or the second clock signal clkbb is at the logic LOW, the slave latch 140 is at the latched state, and the signal at the output node sl_bx is latched in the slave latch 140. In the timing diagram of FIG. 2, the slave latch 140 is latched during one time interval from time t0+τa to time t0+τa+τb+T/2 and during another time interval from time t3=t0+τa+T to time t5=t0+τa+τb+3T/2.

In addition to the wave forms of various clock signals generated by the timing circuit 180, FIG. 2 also depicts the input signal D(t), the output signal Q(t), and the signals at the circuit nodes ml_ax, ml_b, sl_a, and sl_bx. In FIG. 2, as a non-limiting example, if the input signal D(t) has the logic value D1 from time t0 to time t0+T and has the logic value D2 from time t0+T to time t0+2T, then the output signal Q(t) has the logic value D1 from time t2 to time t2+T and has the logic value D2 from time t2+T to time t2+2T. Here, the time t2=t0+τa+τb+T/2. The process of generating the output signal Q(t) from the input signal D(t) is explained in the following, with reference to the signals at the circuit nodes ml_ax, ml_b, sl_a, and sl_bx.

In FIG. 2, beginning from time t1=t0+τa+τb+τc and ending at time t1+τe+T/2, the gated input circuit 110 is set to the connected state, and the signal at the input node ml_ax of the master latch 120 is ~D(t), which is the inverse of the input data D(t). At time t1, the master latch 120 is not latched, and the signal at the output node ml_b of the master latch 120 is ~ml_ax(t), which is the inverse of the signal ml_ax(t) at the input node ml_ax of the master latch 120. At time t1, the transmission gate 130 is at the open state, and the input node sl_a of the slave latch 140 is isolated from the output node ml_b of the master latch 120. At time t1, the slave latch 140 is at the latched state, and the signal at the output node sl_bx of the slave latch 140 is latched to a previous value ~D0, which is the inverse of the signal of the logic value D0. At time t1, the output signal Q(t) of the master-slave flip-flop 100 is maintained at the logic value D0.

In FIG. 2, from time t1 to time t2, the signal ml_b(t) at the output node ml_b is equal to the inverse of the signal ml_ax(t), and the signal ml_ax(t) at the input node ml_ax is equal to the inverse of the input signal D(t). That is, ml_b(t)=~ml_ax(t) and ml_ax(t)=~D(t). Consequently, the signal at the output node ml_b is equal to the input data D(t), which is ml_b(t)=D(t). At time t2, the signal at the output node ml_b of the master latch 120 is equal to the logic value D1. The logic value D1 at the output node ml_b is latched from time t2 to time t2+τd+T/2. Additionally, at time t2, the transmission gate 130 is at the connected state, and the signal sl_a(t) at the input node sl_a of the slave latch 140 is identical to the signal ml_b(t) at the output node ml_b of the master latch 120, which has the logic value D1. Beginning from time t2, the slave latch 140 is unlatched, and the signal at the output node sl_bx is the inverse of the signal at the input node sl_a. At least during the time period from time t2 to time t3, the signal at the input node sl_a of the slave latch 140 is identical to the logic value D1. Consequently, from time t2 to time t3, the signal at the output node sl_bx of the slave latch 140 is identical to ~D1 (the inverse of the logic signal D1). The logic value ~D1 at the output node sl_bx of the slave latch 140 is latched from time t3 to time t5=t3+τb+T/2. Therefore, the output node sl_bx is at the logic value ~D1 from time t2 to time t5, and the output signal Q(t) of the master-slave flip-flop 100 is the logic value D1 from time t2 to time t5=t2+T.

Similarly, in the example of FIG. 2, when the input signal D(t) has the logic value D2 from time t0+T to time t0+2T, the output signal Q(t) of the master-slave flip-flop 100 in response generates the logic value D2 from time t5 to time t5+T. Specifically, in FIG. 2, at least during the time period from t4 to time t5, the gated input circuit 110 is at the connected state, the master latch 120 is at the unlatched state, and the signal at the output node ml_b of the master latch 120 is at the logic value D2. Beginning at time t5, the logic value D2 at the output node ml_b is latched. At least during the time period from t5 to time t6, the output node ml_b of the master latch 120 is maintained with the logic value D2, the transmission gate 130 is at the connected state, the slave latch 140 is at the unlatched state, and the signal at the output node sl_bx of the slave latch 140 is at the logic value ~D2. From time t6 to time t5+T (not shown in the figure), the output node sl_bx of the slave latch 140 is latched at the logic value ~D2. Consequently, from time t5 to time t5+T, the output signal Q(t) of the master-slave flip-flop 100 is D2, which is the inverse of the logic value ~D2 at the output node sl_bx from time t5 to time t5+T.

Figure 3A:
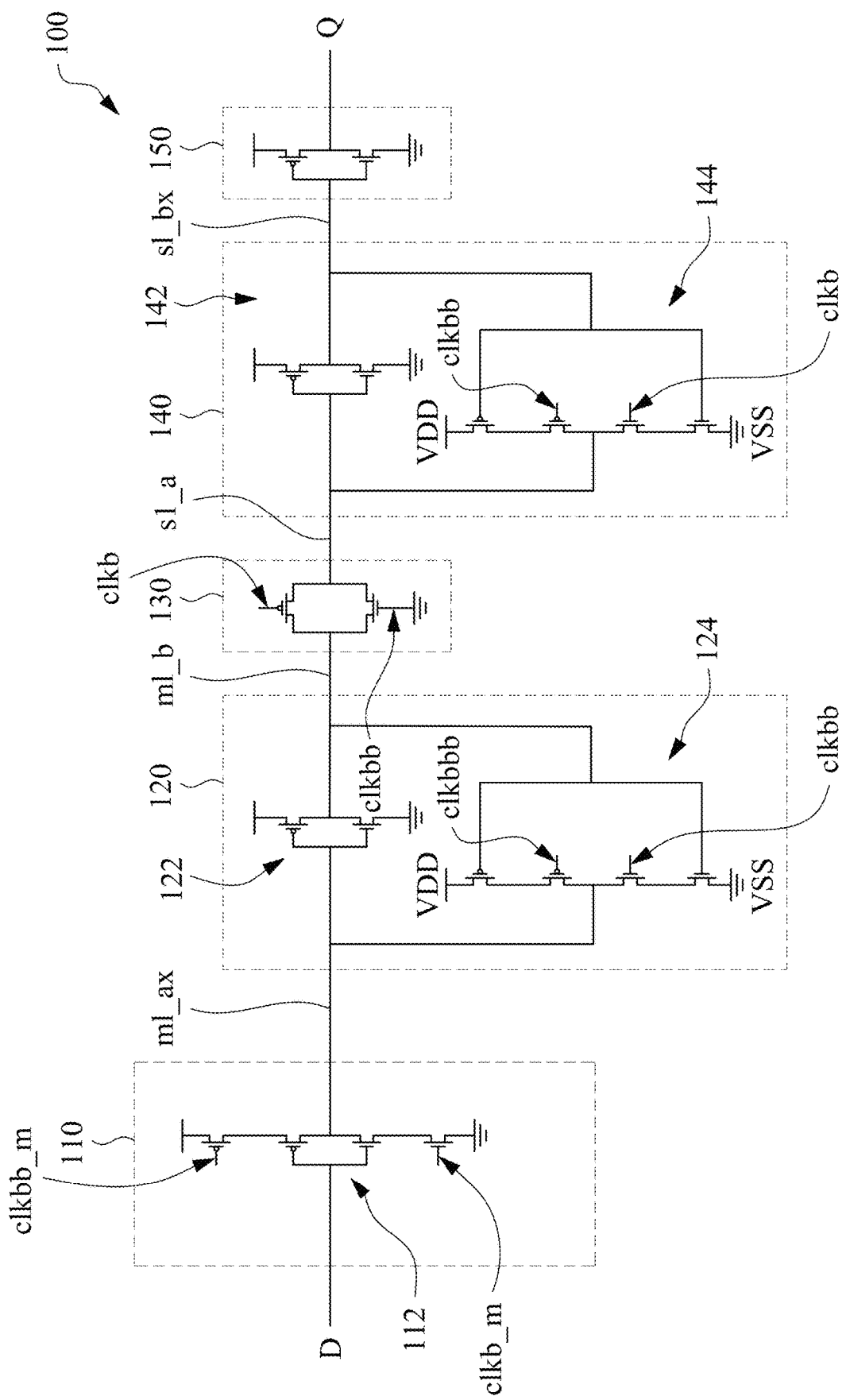
FIGS. 3A-3B are circuit diagrams of one specific implementation of the master-slave flip-flop and the timing circuit in FIGS. 1A-1B, in accordance with some embodiments.
Figure 3B:
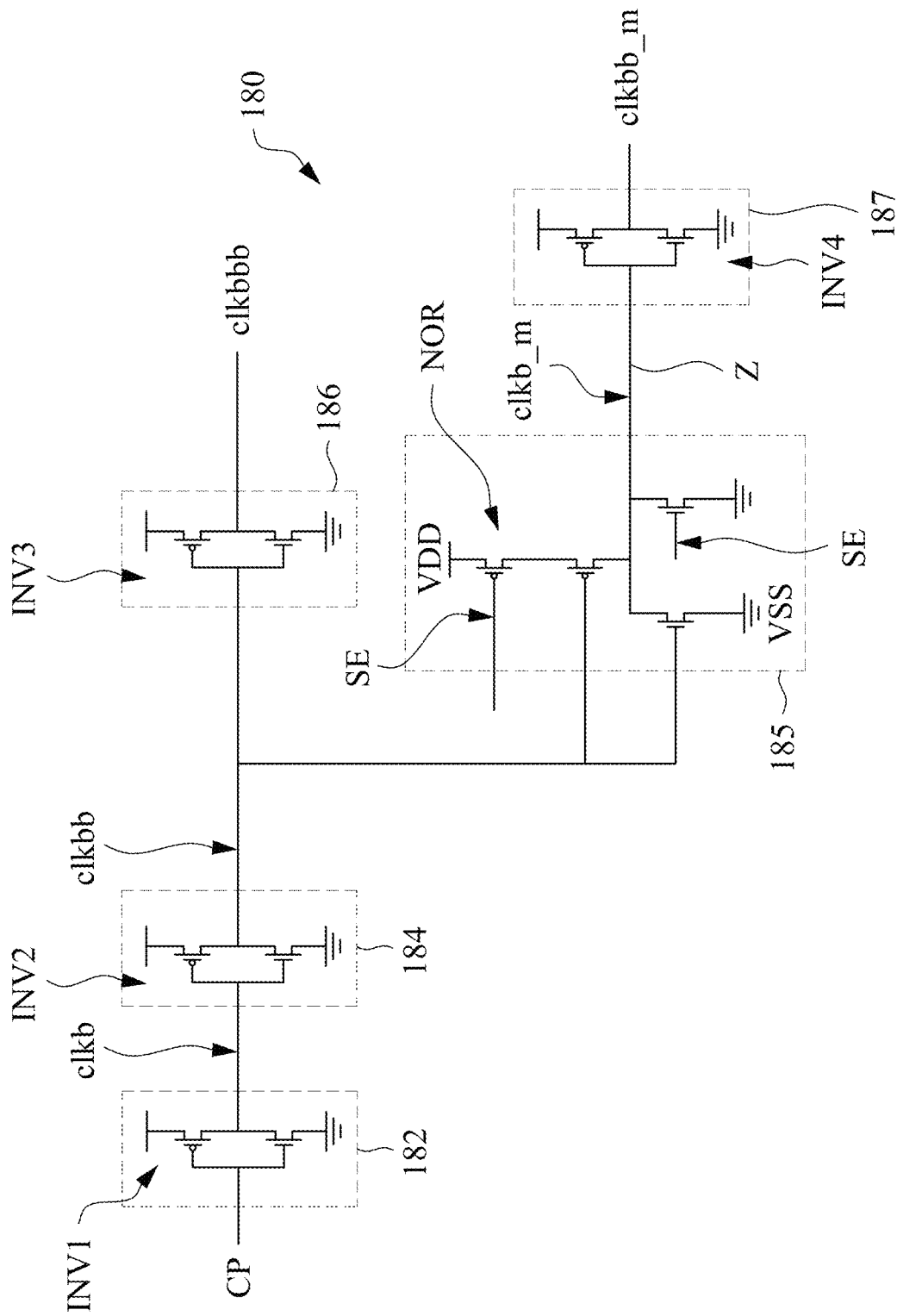

FIGS. 3A-3B are circuit diagrams of one specific implementation of the master-slave flip-flop 100 and the timing circuit 180 in FIGS. 1A-1B, in accordance with some embodiments. In FIG. 3A, each of the inverters 122, 142, and 150 of FIG. 1A includes a p-type transistor and an n-type transistor serially connected between two power supplies. Also in FIG. 3A, the transmission gate 130 includes a p-type transistor and an n-type transistor parallelly connected between the input terminal and output terminal of the transmission gate 130, and the gate terminals of the p-type transistor and the n-type transistor are correspondingly configured to receive the two clock signals clkbb and clkb for controlling the transmission state of the transmission gate 130. When the clock signal clkbb is at the logic HIGH and/or the first clock signal clkb is at the logic LOW, the transmission state of the transmission gate 130 is at the connected state, and the output terminal of the transmission gate 130 is conductively connected to the input terminal of the transmission gate 130. When the clock signal clkbb is at the logic LOW and the first clock signal clkb is at the logic HIGH, the transmission state of the transmission gate 130 is at the open state, and the signal at the output terminal of the transmission gate 130 is not responsive to signal changes at the input terminal of the transmission gate 130.

In FIG. 3A, each of the clocked inverters 112, 124, and 144 of FIG. 1A includes two p-type transistors and two n-type transistors all serially connected between two power supplies. In each of the clocked inverters 112, 124, and 144, the gate terminals of the first p-type transistor and the first n-type transistor are connected together as the inverter input terminal, while the gate terminals of the second p-type transistor and the second n-type transistor are correspondingly configured to receive the two clock signals for controlling the inverter transmission state. For example, in the clocked inverter 124, the gate terminals of the first p-type transistor and the first n-type transistor are connected together as the inverter input terminal (which is connected to the output of the inverter 122), the gate terminal of the second p-type transistor is configured to receive the clock signal clkbbb, and the gate terminal of the second n-type transistor is configured to receive the clock signal clkbb. When the clock signal clkbbb is at the logic LOW and/or the clock signal clkbb is at the logic HIGH, the clocked inverter 124 functions as an inverter which latches the signal at the output node ml_b of the master latch 120. When the clock signal clkbbb is at the logic HIGH and the clock signal clkbb is at the logic LOW, the clocked inverter 124 is in the open state, and the output signal of the clocked inverter 124 is not responsive to signal changes at the input terminal of the clocked inverter 124. When the clocked inverter 124 is in the open state, the master latch 120 is unlatched.

Similarly, in the clocked inverter 144, the gate terminals of the first p-type transistor and the first n-type transistor are connected together as the inverter input terminal (which is connected to the output of the inverter 142), the gate terminal of the second p-type transistor is configured to receive the clock signal clkbb, and the gate terminal of the second n-type transistor is configured to receive the clock signal clkb. When the clock signal clkbb is at the logic LOW and/or the clock signal clkb is at the logic HIGH, the clocked inverter 144 functions as an inverter which latches the signal at the output node sl_bx of the slave latch 140. When the clock signal clkbb is at the logic HIGH and the clock signal clkb is at the logic LOW, the clocked inverter 144 is in the open state, and the output signal of the clocked inverter 144 is not responsive to signal changes at the input terminal of the clocked inverter 144. When the clocked inverter 144 is in the open state, the slave latch 140 is unlatched.

In FIG. 3B, each of the inverters INV1, INV2, INV3, and INV4 of FIG. 1B includes a p-type transistor and an n-type transistor serially connected between two power supplies. The NOR gate of FIG. 1B includes two p-type transistors and two n-type transistors. The two p-type transistors are serially connected between the power supply VDD and the output node Z. The two n-type transistors are parallelly connected between the output node Z and the power supply VSS. The gate terminals of the first p-type transistor and the first n-type transistor in the NOR gate are connected together as a first input terminal which is connected to the output of the inverter INV2, while the gate terminals of the second p-type transistor and the second n-type transistor in the NOR gate constitute a second input terminal which is configured to receive the scan enable signal SE.

In FIG. 3A, the gated input circuit 110 is implemented as a clocked inverter 112. The gate terminals of the first p-type transistor and the first n-type transistor in the clocked inverter 112 are connected together as the input terminal of the gated input circuit 110. The gate terminal of the second p-type transistor in the clocked inverter 112 is configured to receive the clock signal clkbb_m, and the gate terminal of the second n-type transistor in the clocked inverter 112 is configured to receive the clock signal clkb_m. When the clock signal clkbb_m is at the logic LOW and/or the clock signal clkb_m is at the logic HIGH, the clocked inverter 112 functions as an inverter which generates an output signal that is the inverse of the input data signal. When the clock signal clkbb_m is at the logic HIGH and the clock signal clkb_m is at the logic LOW, the clocked inverter 112 is in the open state, and the output signal of the clocked inverter 112 is not responsive to signal changes at the input terminal of the clocked inverter 112. When the clocked inverter 112 is in the open state, the input node ml_ax of the master latch 120 is isolated from the input terminal D of the gated input circuit 110.

In the timing diagram of FIG. 2, because the clock signal clkb_m is delayed from the second clock signal clkbb with the delay time τc, the transmission gate 130 is opened (at the falling edge of the clock signal clkbb in FIG. 2) before the gated input circuit 110 is changed to the connected state (at the rising edge of the clock signal clkb_m in FIG. 2). Consequently, signal changes at the input of the gated input circuit 110 during the time interval from the falling edge of the base clock signal CP to the falling edge of the clock signal clkbb do not get propagated to the input node sl_a of the slave latch 140.

The timing circuit 180 provides improved reliability for the operation sequence that the transmission gate 130 is opened before the gated input circuit 110 is changed to the connected state. With the timing circuit 180, the above mentioned operation sequence is ensured even if the falling edge of the clock signal clkbb has large variations. In some other designs of the timing circuit; however, as the supply voltage difference between VDD and VSS is lowered and approaches a threshold, the variations in the falling edge of the clock signal clkbb may become too large and the variations may have negative impact to the reliability for the above mentioned operation sequence. In some embodiments, because of the improved reliability for the above mentioned operation sequence, the supply voltage difference between VDD and VSS in the timing circuit 180 is lower than that supply voltage difference in some other designs of the timing circuit.

Figure 4A:
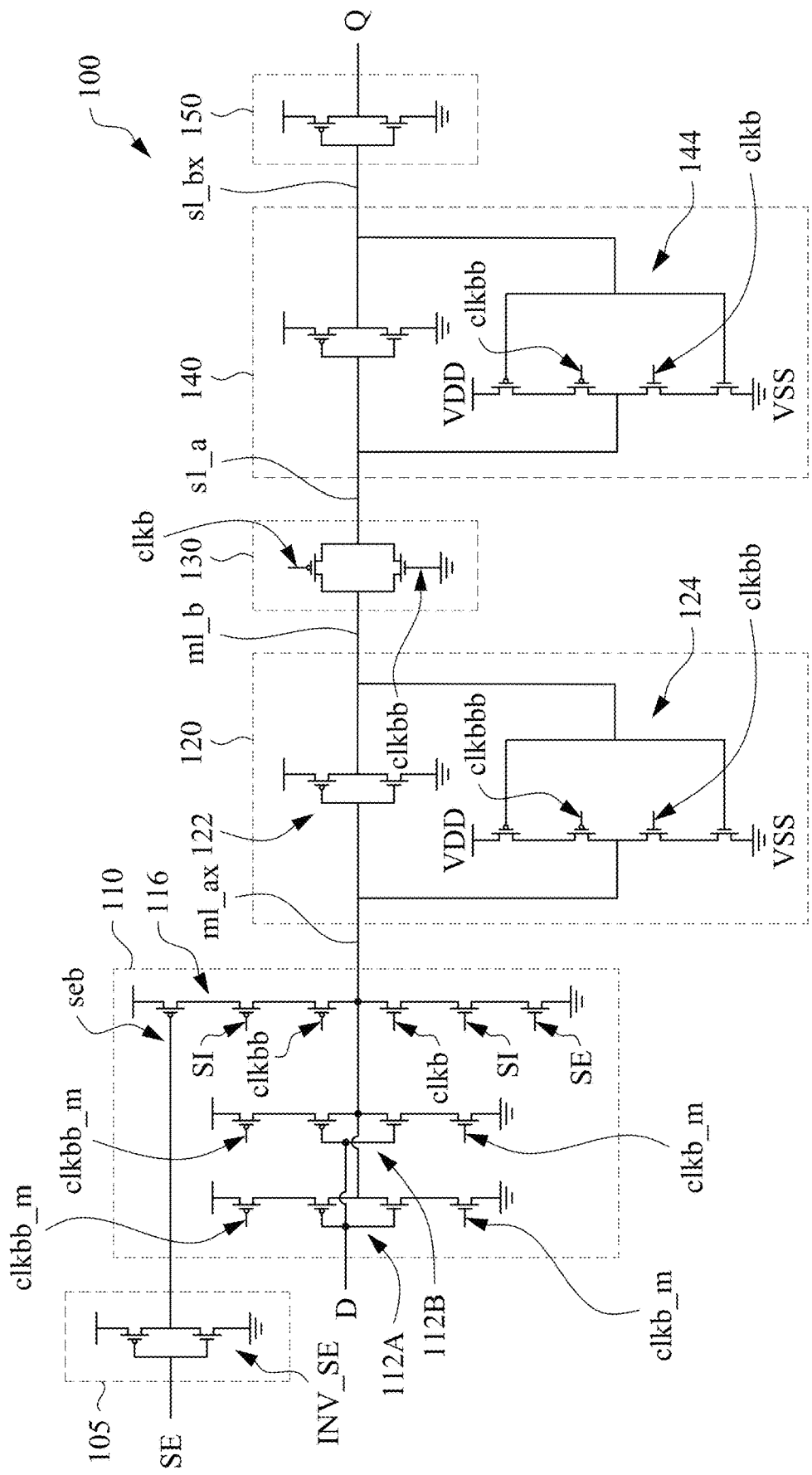
FIGS. 4A-4B are circuit diagrams of one specific implementation of the master-slave flip-flop and the timing circuit in FIGS. 1A-1B, in accordance with some embodiments.
Figure 4B:
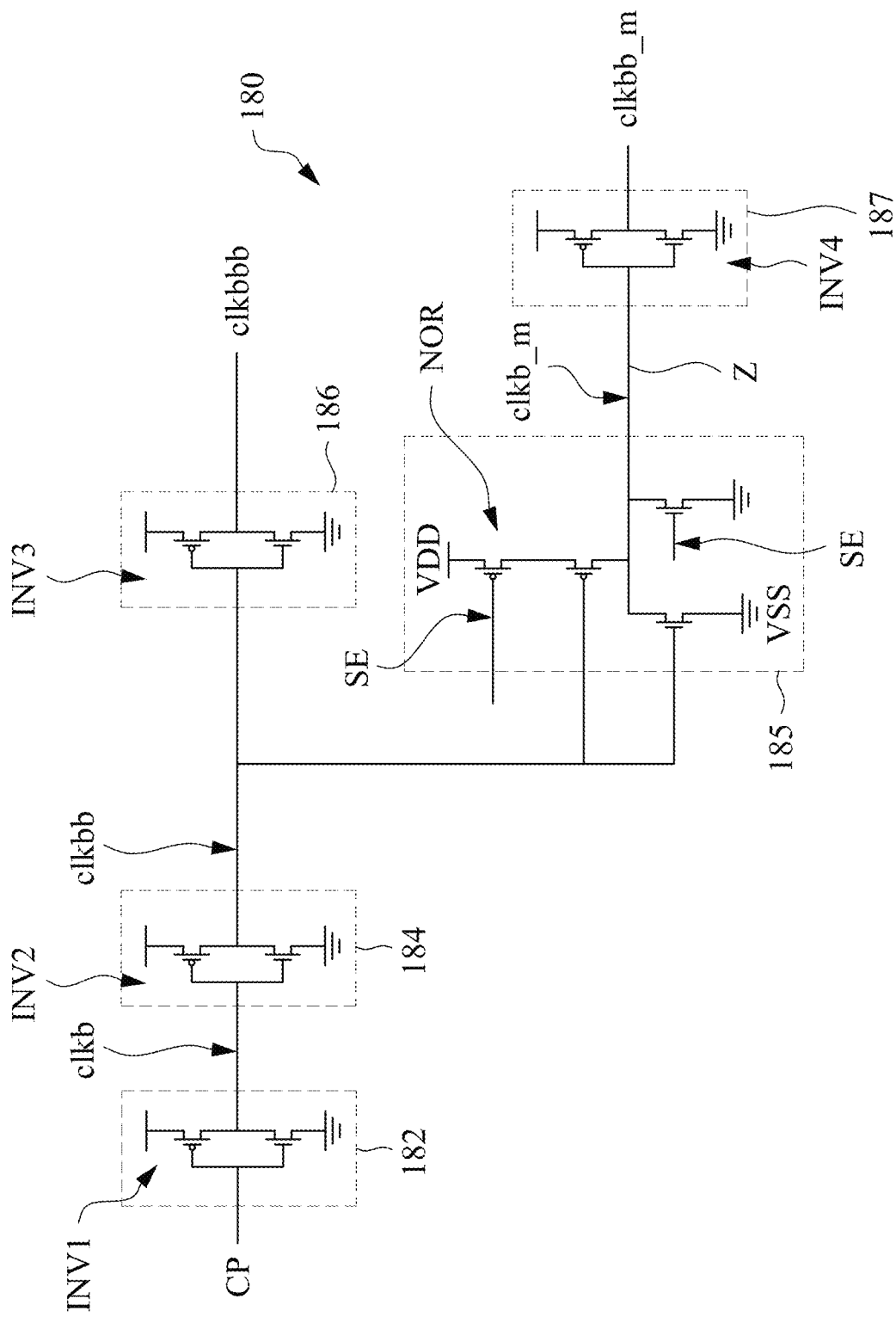

FIGS. 4A-4B are circuit diagrams of one specific implementation of the master-slave flip-flop 100 and the timing circuit 180 in FIGS. 1A-1B, in accordance with some embodiments. For the timing circuit 180, the implementation in FIG. 4B is identical to the implementation in FIG. 3B. For the master-slave flip-flop 100, the implementation in FIG. 4A is modified based on the implementation in FIG. 3A. While the gated input circuit 110 in FIG. 3A is implemented as a single clocked inverter 112, the gated input circuit 110 in FIG. 4A includes two clocked inverters 112A and 112B and another scan input circuit 116. The input terminals of the clocked inverters 112A and 112B are connected together to receive the input data D for the gated input circuit 110. The output terminals of the clocked inverters 112A and 112B and the output terminal of the scan input circuit 116 are all connected together as the output terminal of the gated input circuit 110. Each of the two clocked inverters 112A and 112B is controlled by the two clock signals clkbb_m and clkb_m.

The scan input circuit 116 includes three p-type transistors and three n-type transistors all serially connected between two power supplies. The three p-type transistors are serially connected between the power supply VDD and the output terminal of the scan input circuit 116 (which is directly connected to the input node ml_ax of the master latch 120). The three n-type transistors are serially connected between the output terminal of the scan input circuit 116 and the power supply VSS. The gate terminals of the first p-type transistor and the first n-type transistor in the scan input circuit 116 are configured to receive the scan input signal SI. The gate terminal of the second p-type transistor in the scan input circuit 116 is configured to receive the clock signal clkbb, and the gate terminal of the second n-type transistor in the scan input circuit 116 is configured to receive the clock signal clkb. The gate terminals of the third p-type transistor in the scan input circuit 116 is configured to receive from the inverter 105 the signal seb, and the third n-type transistor in the scan input circuit 116 is configured to receive the scan enable signal SE. The input of the inverter 105 is also configured to receive the scan enable signal SE, and the signal seb at the output of the inverter 105 is an inverse of the scan enable signal SE.

In operation, when the scan enable signal SE is at logic HIGH, both the third p-type transistor and the third n-type transistor in the scan input circuit 116 are in the conducting state, and the scan input circuit 116 is enabled. When the scan input circuit 116 is enabled, the scan input circuit 116 is equivalent to a clocked inverter that is controlled by the clock signals clkbb and clkb and also receives the scan input signal SI as the input signal. Additionally, when the scan enable signal SE is kept at logic HIGH, one of the inputs of the NOR gate is kept at the logic HIGH. As a consequence, the clock signals clkb_m is kept at the logic LOW and the clock signals clkbb_m is kept at the logic HIGH. As the clock signals clkb_m and clkbb_m are correspondingly applied to the gate terminals of the n-type transistors and the second p-type transistors in each of the clocked inverters 112A and 112B, the logic LOW (i.e., the clock signal clkb_m) at the gate terminals of the n-type transistors and the logic HIGH (i.e., the clock signal clkbb_m) at the gate terminal of the p-type transistors set each of the clocked inverters 112A and 112B into the open state, which isolates the signal at the input node ml_ax of the master latch 129 from the data input signal D at the input of the gated input circuit 110 during the time period when the scan enable signal SE is kept at the logic HIGH.

In the gated input circuit 110, when the scan enable signal SE is at the logic HIGH, the data input signal D is disabled and the scan input signal SI is enabled, for generating the output signal at output terminal of the gated input circuit 110. Conversely, when the scan enable signal SE is at the logic LOW, the data input signal D is enabled and the scan input signal SI is disabled, for generating the output signal at output terminal of the gated input circuit 110.

Figure 5A:
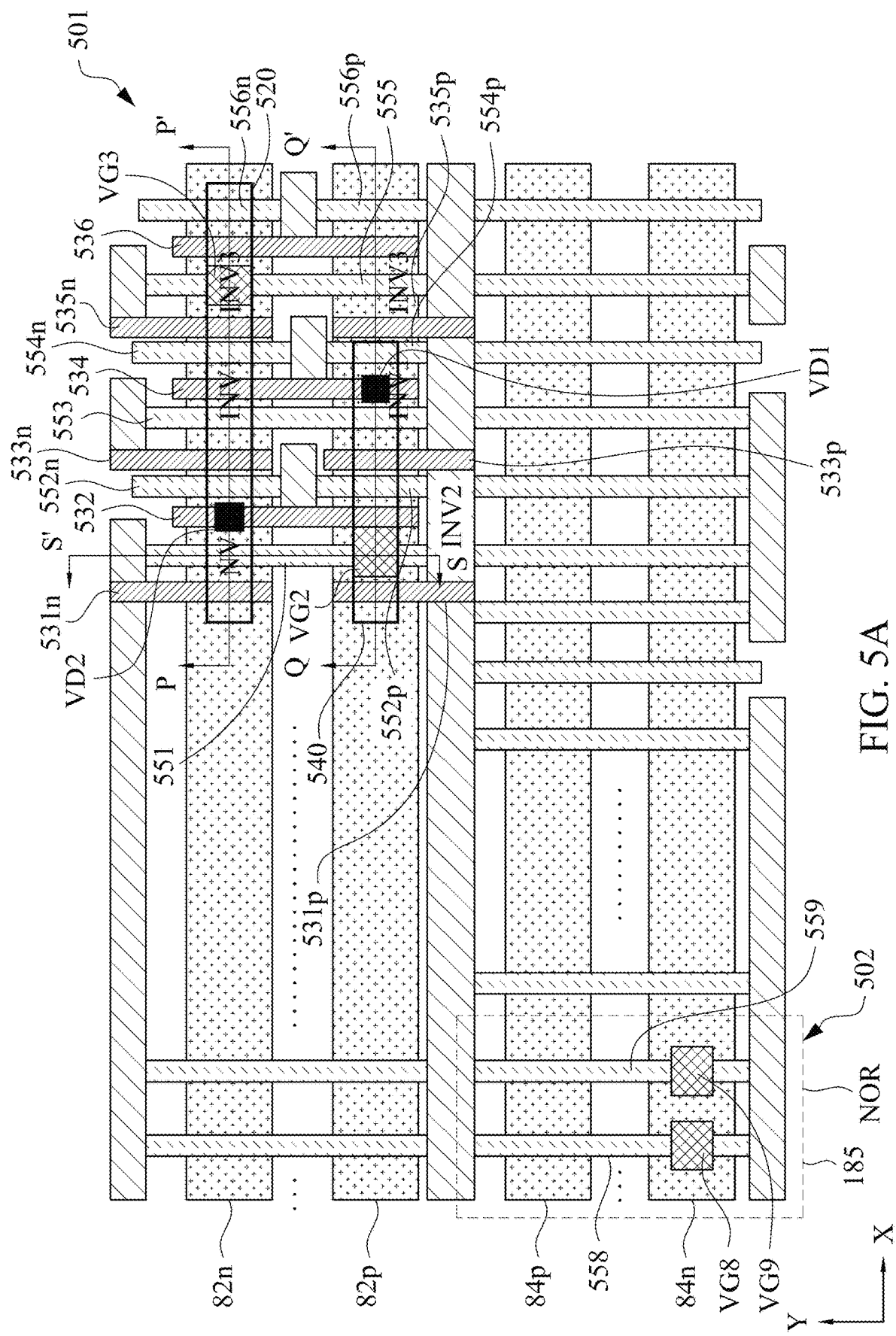
FIG. 5A is a layout diagram of parts of the timing circuit in FIG. 3B and FIG. 4B, in accordance with some embodiments.
Figure 5E:
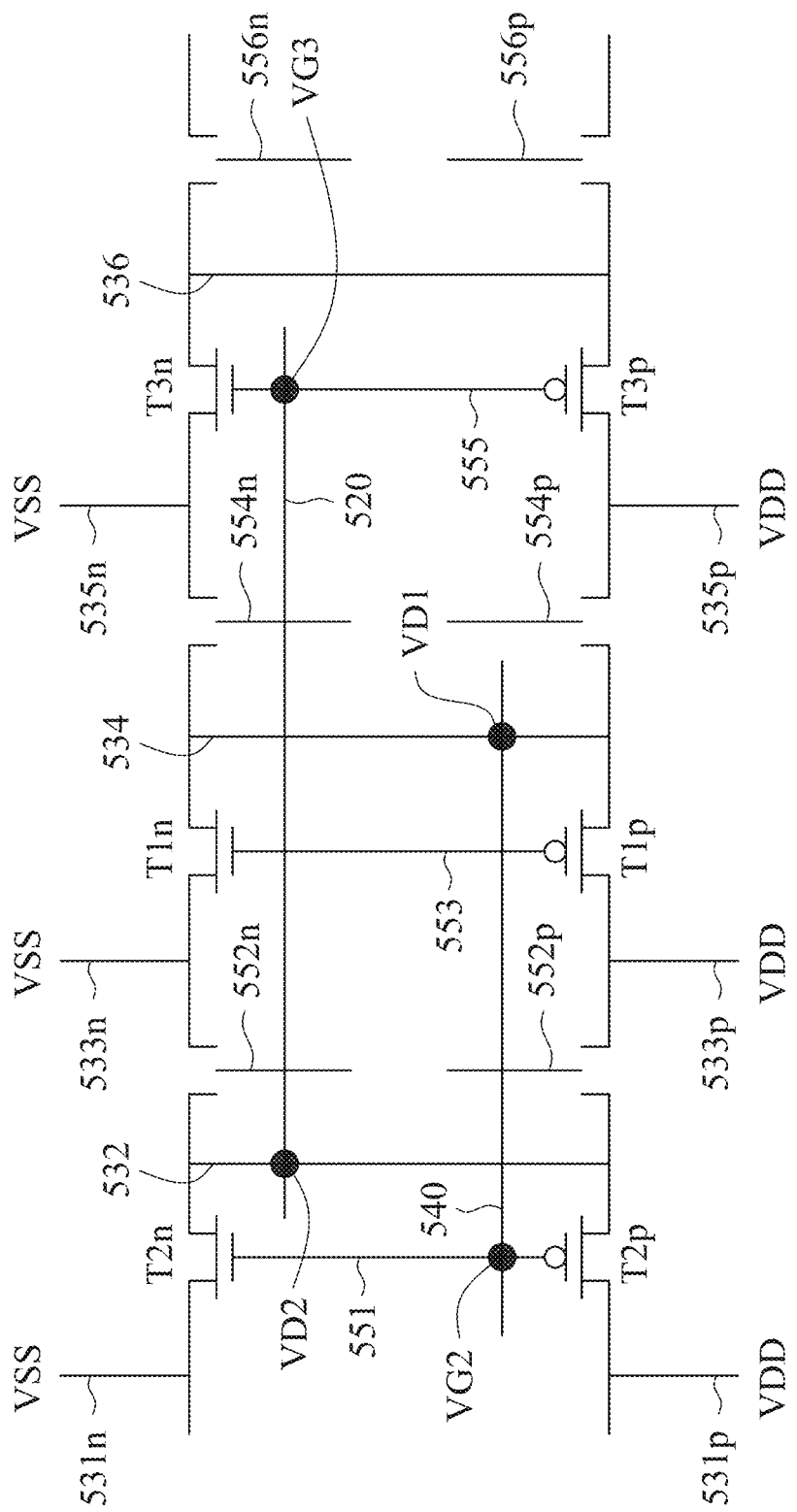
FIG. 5E is an equivalent circuit for a part of the layout diagram in FIG. 5A, in accordance with some embodiments.

FIG. 5A is a layout diagram of parts of the timing circuit 180 in FIG. 3B and FIG. 4B, in accordance with some embodiments. FIGS. 5B-5D are cross-sectional views of the timing circuit 180 as specified by the layout diagram in FIG. 5A, in accordance with some embodiments. FIG. 5E is an equivalent circuit for a part of the layout diagram in FIG. 5A, in accordance with some embodiments.

In FIG. 3B and FIG. 4B, the timing circuit 180 includes four inverters INV1-INV4 and a NOR gate. In the timing circuit 180 as specified by the layout diagram of FIG. 5A, the inverters INV1, INV2, and INV3 are fabricated in a first area 501 in the integrated circuit, and the NOR gate is fabricated in a second area 502. The location of the inverter INV4 is not specifically identified in the layout diagram.

As specified by the layout diagram of FIG. 5A, each of the inverters INV1, INV2, and INV3 includes a corresponding gate-conductor intersecting a p-type active region structure 82p and an n-type active region structure 82n in the first area 501. In some embodiments, the p-type active region structure 82p and the n-type active region structure 82n are fin structures, and the transistors in the inverters INV1, INV2, and INV3 are fin transistors. In some embodiments, the p-type active region structure 82p and the n-type active region structure 82n are nano-sheet structures, and the transistors in the inverters INV1, INV2, and INV3 are nano-sheet transistors. In some embodiments, the p-type active region structure 82p and the n-type active region structure 82n are nano-wire structures, and the transistors in the inverters INV1, INV2, and INV3 are nano-wire transistors.

The gate-conductor 551 intersects the p-type active region structure 82p and the n-type active region structure 82n and forms correspondingly the channel regions for the p-type transistor T2p and the n-type transistor T2n in the INV2. The gate-conductor 553 intersects the p-type active region structure 82p and the n-type active region structure 82n and forms correspondingly the channel regions for the p-type transistor T1p and the n-type transistor T1n in the INV1. The gate-conductor 555 intersects the p-type active region structure 82p and the n-type active region structure 82n and forms correspondingly the channel regions for the p-type transistor T3p and the n-type transistor T3n in the INV3. While each of the dummy gate-conductors 552p, 554p, 556p, 552n, 554n, 556n intersects the active region structures, each intersection does not correspond to the channel of a working transistor in the timing circuit 180. The equivalent circuit formed by the three p-type transistors (T1p, T2p, and T3p) and the three n-type transistors (T1n, T2n, and T3n) in the three inverters (INV1, INV2, and INV3) in FIG. 5A are depicted in FIG. 5E.

In the layout diagram of FIG. 5A and as shown in FIG. 5E, each of the terminal-conductors 531p, 533p, and 535p intersects the p-type active region structure 82p at a corresponding source region of one of the p-type transistors T2p, T1p, and T3p. Each of the terminal-conductors 531n, 533n, and 535n intersects the n-type active region structure 82n at a corresponding source region of one of the n-type transistors T2n, T1n, and T3n. Each of the terminal-conductors 531p, 533p, and 535p is connected to a power rail (not shown in FIG. 5A) configured to provide the power supply VDD. Each of the terminal-conductors 531n, 533n, and 535n is connected to a power rail (not shown in FIG. 5A) configured to provide the power supply VSS.

In the layout diagram of FIG. 5A and as shown in FIG. 5E, the terminal-conductor 534 intersects the p-type active region structure 82p at the drain region for the p-type transistor T1p and intersects the n-type active region structure 82n at the drain region for the n-type transistor T1n. The terminal-conductor 534 forms the output terminal of the inverter INV1. The terminal-conductor 534 is conductively connected to the horizontal conducting line 540 through the terminal via-connector VD1. The horizontal conducting line 540 is conductively connected to the gate-conductor 551 through the gate via-connector VG2. The gate-conductor 551 functions as the input terminal of the inverter INV2. The terminal-conductor 532 intersects the p-type active region structure 82p at the drain region for the p-type transistor T2p and intersects the n-type active region structure 82n at the drain region for the n-type transistor T2n. The terminal-conductor 532 forms the output terminal of the inverter INV2. The terminal-conductor 532 is conductively connected to the horizontal conducting line 520 through the terminal via-connector VD2. The horizontal conducting line 520 is conductively connected to the gate-conductor 555 through the gate via-connector VG3. The gate-conductor 555 functions as the input terminal of the inverter INV3.

In addition to FIG. 5A and FIG. 5E, the connection from the output terminal of the inverter INV1 to the input terminal of the inverter INV2 is also shown in the cross-sectional view of FIG. 5D, and the connection from the output terminal of the inverter INV2 to the input terminal of the inverter INV3 is also shown in cross-sectional view of FIG. 5C.

FIG. 5C is a cross-sectional view of the circuit in FIG. 5A in a cutting plane P-P', in accordance with some embodiments. In FIG. 5C, each of the gate-conductors 551, 552n, 553, 554n, 555, and 556n intersects the n-type active region structure 82n on the substrate 510. The terminal-conductor 532 is conductively connected to the horizontal conducting line 520 through the terminal via-connector VD2. The horizontal conducting line 520 is conductively connected to the gate-conductor 555 through the gate via-connector VG3. The horizontal conducting line 520 is in the first connection layer MO overlying the isolation materials covering the gate-conductors and the terminal-conductors.

FIG. 5D is a cross-sectional view of the circuit in FIG. 5A in a cutting plane Q-Q', in accordance with some embodiments. In FIG. 5D, each of the gate-conductors 551, 552p, 553, 554p, 555, and 556p intersects the p-type active region structure 82p on the substrate 510. The terminal-conductor 534 is conductively connected to the horizontal conducting line 540 through the terminal via-connector VD1. The horizontal conducting line 540 is conductively connected to the gate-conductor 551 through the gate via-connector VG2. The horizontal conducting line 540 is in the first connection layer MO overlying the isolation materials covering the gate-conductors and the terminal-conductors. As shown in FIG. 5D, the gate via-connector VG2 for connecting the gate-conductor 551 with the horizontal conducting line 540 is at least partially positioned atop the p-type active region structure 82p. The position of the gate via-connector VG2 relative to the p-type active region structure 82p is also depicted in FIG. 5B.

FIG. 5B is a cross-sectional view of the circuit in FIG. 5A in a cutting plane S-S', in accordance with some embodiments. As shown in FIG. 5B, the gate-conductor 551 intersects both the p-type active region structure 82p and the n-type active region structure 82n on the substrate 510. The horizontal conducting lines 520 and 540 are in the first connection layer MO above the gate-conductor 551. The horizontal conducting line 540 is conductively connected to the gate-conductor 551 through the gate via-connector VG2. The combination of the cross-sectional views in FIG. 5B and FIG. 5D indicates that all of the gate via-connector VG2 is positioned atop the p-type active region structure 82p. In some alternative embodiments, only a portion of the gate via-connector VG2 is positioned atop the p-type active region structure 82p. A non-limiting example of the integrated circuits as implemented in the alternative embodiments is shown in FIGS. 6A-6D.

Figure 6A:
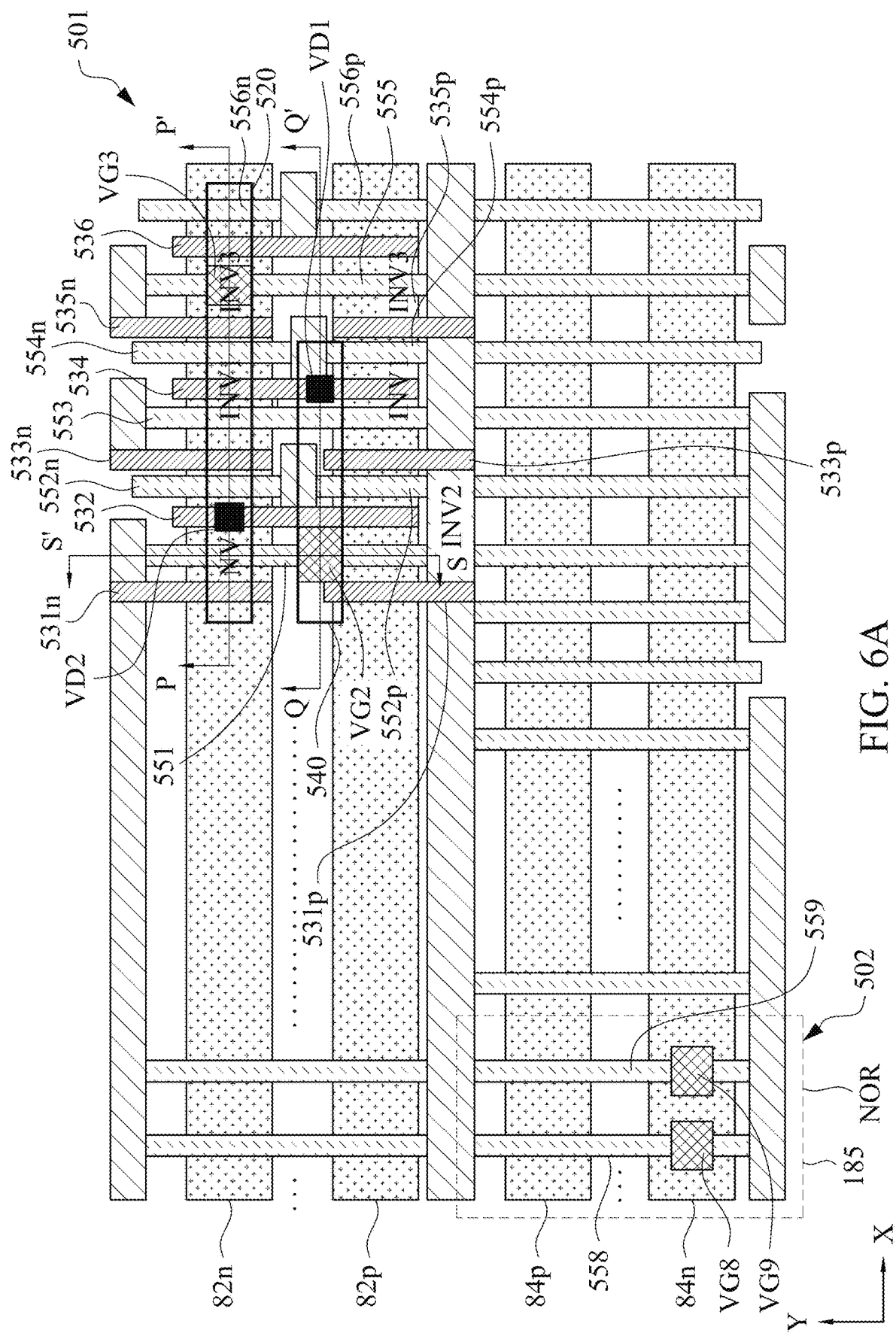
FIG. 6A is a layout diagram of parts of the timing circuit in FIG. 3B and FIG. 4B, in accordance with some embodiments.

FIG. 6A is a layout diagram of parts of the timing circuit 180 in FIG. 3B and FIG. 4B, in accordance with some embodiments. FIG. 6B is a cross-sectional view of the circuit in FIG. 6A in a cutting plane S-S', in accordance with some embodiments. FIG. 6C is a cross-sectional view of the circuit in FIG. 6A in a cutting plane P-P', in accordance with some embodiments. FIG. 6D is a cross-sectional view of the circuit in FIG. 6A in a cutting plane Q-Q', in accordance with some embodiments.

The layout diagram in FIG. 6A is modified from the layout diagram in FIG. 5A by shifting the gate via-connector VG2, the terminal via-connector VD1, and the horizontal conducting line 540 along the Y-direction such that only a portion of the gate via-connector VG2 is positioned directly atop the p-type active region structure 82p. The equivalent circuit for the layout diagram in FIG. 5A is identical to the equivalent circuit for the layout diagram in FIG. 6A; therefore, FIG. 5E is also an equivalent circuit for parts of the layout diagram in FIG. 6A, in accordance with some embodiments.

Furthermore, because the layout diagram in FIG. 6A is a modification of the layout diagram in FIG. 5A, the cross-sectional views in FIG. 6B and FIG. 6D are modified from the cross-sectional views in FIG. 5B and FIG. 5D accordingly, while the cross-sectional view in FIG. 6C is the same as the cross-sectional view in FIG. 5C.

In FIG. 6D, the terminal-conductor 534 is conductively connected to the horizontal conducting line 540 through the terminal via-connector VD1. The horizontal conducting line 540 is conductively connected to the gate-conductor 551 through the gate via-connector VG2. The horizontal conducting line 540 is in the first connection layer MO overlying the isolation materials covering the gate-conductors and the terminal-conductors. While the p-type active region structure 82p on the substrate 510 is in the cross-sectional view in FIG. 5D, the p-type active region structure 82p on the substrate 510 does not appear in the cross-sectional view in FIG. 6D, because the cutting plane Q-Q' in FIG. 6A does not pass through the p-type active region structure 82p.

In FIG. 6B, the gate-conductor 551 intersects both the p-type active region structure 82p and the n-type active region structure 82n on the substrate 510. The horizontal conducting lines 520 and 540 are in the first connection layer MO above the gate-conductor 551. The horizontal conducting line 540 is conductively connected to the gate-conductor 551 through the gate via-connector VG2. The combination of the cross-sectional views in FIG. 6B and FIG. 6D indicates that only a portion of the gate via-connector VG2 is positioned directly atop the p-type active region structure 82p.

Figure 7A:
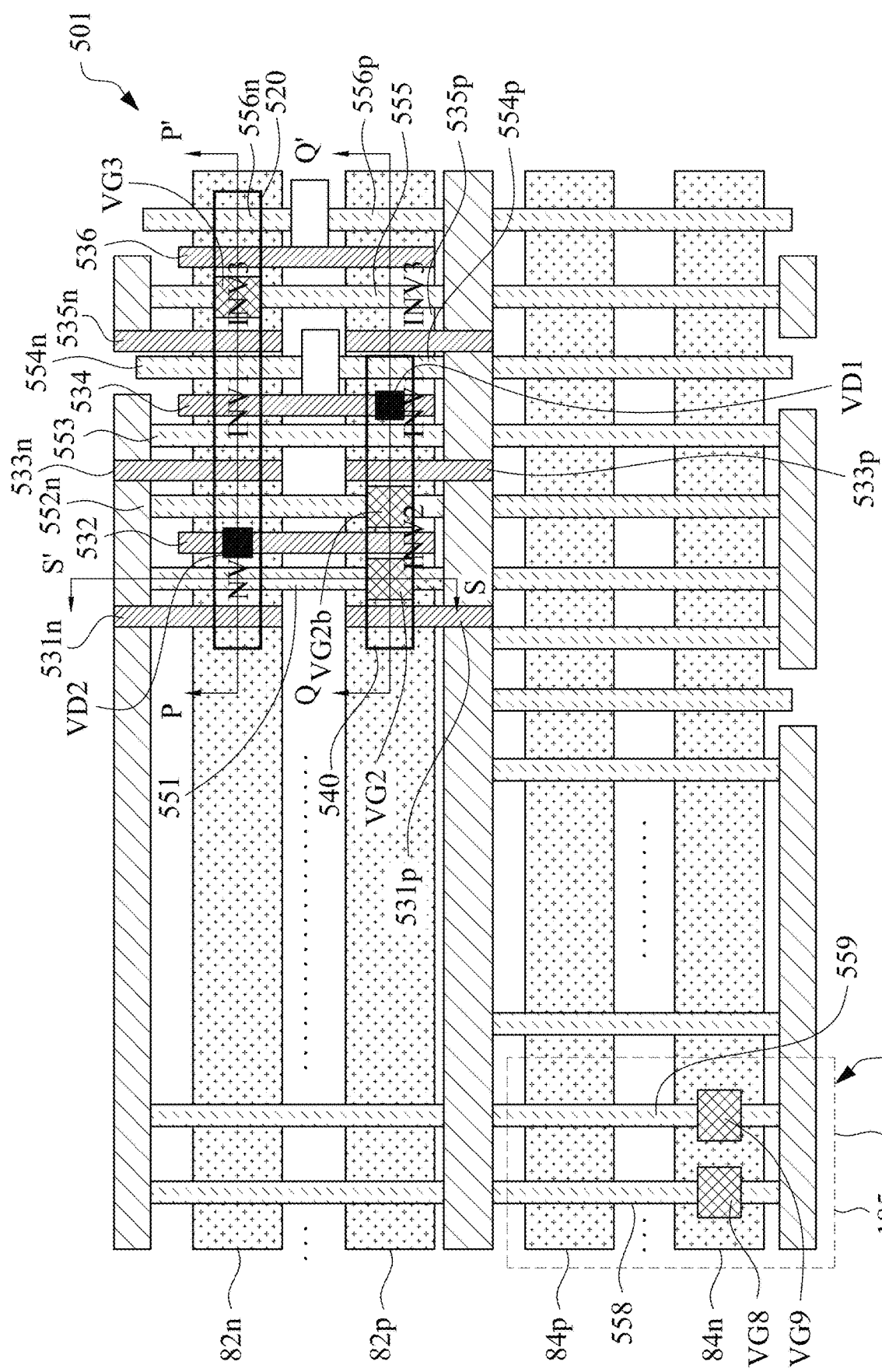
FIG. 7A is a layout diagram of parts of the timing circuit in FIG. 3B and FIG. 4B, in accordance with some embodiments.
Figure 7E:
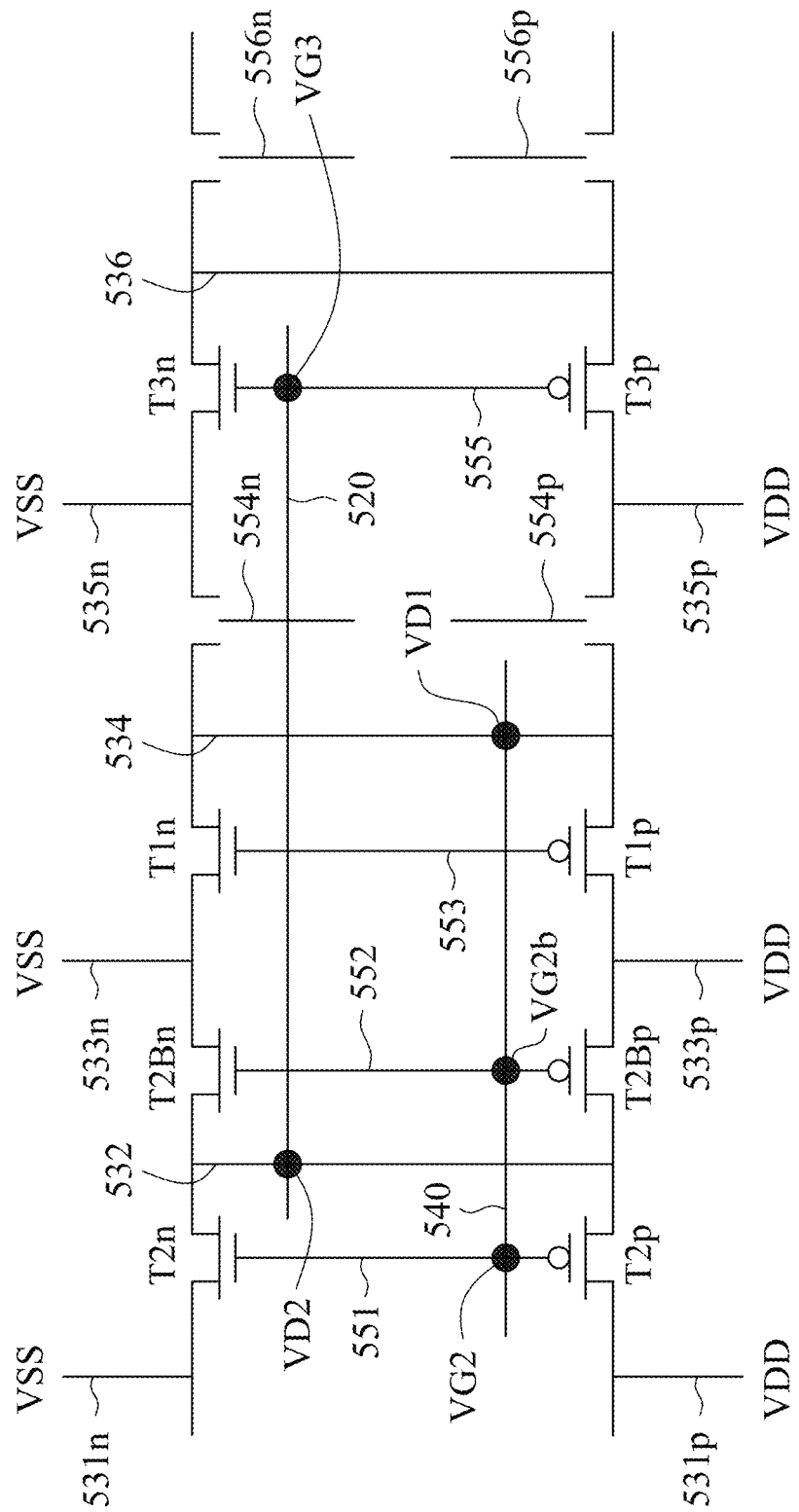
FIG. 7E is an equivalent circuit for a part of the layout diagram in FIG. 7A, in accordance with some embodiments.

Another modification of the layout diagram in FIG. 5A is the layout diagram in FIG. 7A. FIG. 7A is a layout diagram of parts of the timing circuit 180 in FIG. 3B and FIG. 4B, in accordance with some embodiments. FIG. 7B is a cross-sectional view of the circuit in FIG. 7A in a cutting plane S-S', in accordance with some embodiments. FIG. 7C is a cross-sectional view of the circuit in FIG. 7A in a cutting plane P-P', in accordance with some embodiments. FIG. 7D is a cross-sectional view of the circuit in FIG. 7A in a cutting plane Q-Q', in accordance with some embodiments. FIG. 7E is an equivalent circuit for a part of the layout diagram in FIG. 7A, in accordance with some embodiments.

The layout diagram in FIG. 7A is modified from the layout diagram in FIG. 5A by replacing the dummy gate-conductors 552n and 552p with the gate-conductor 552. The gate-conductor 552 intersects the p-type active region structure 82p and the n-type active region structure 82n and forms correspondingly the channel regions for the p-type transistor T2Bp and the n-type transistor T2Bn in the inverter INV2. The gate-conductor 552 is conductively connected to the horizontal conducting line 540 through the gate via-connector VG2b. In FIG. 7A and FIG. 7E, the inverter INV2 formed by the transistors T2p, T2n, T2Bp, and T2Bn has improved driving strength as compared with the inverter INV2 (which is formed by the transistors T2p and T2n) in FIG. 5A and FIG. 5E. That is, the driving strength of the inverter INV2 in FIG. 7A is larger than the driving strength of the inverter INV2 in FIG. 5A.

Furthermore, because the layout diagram in FIG. 7A is a modification of the layout diagram in FIG. 5A, the cross-sectional views in FIG. 7C and FIG. 7D are modified from the cross-sectional views in FIG. 5C and FIG. 5D accordingly, while the cross-sectional views in FIG. 7B is the same as the cross-sectional view in FIG. 5B. In FIG. 7C, the gate-conductor 552 replaces the dummy gate-conductors 552n in FIG. 5C, and the gate-conductors 552 intersects the n-type active region structure 82n at the channel region of the n-type transitory T2Bn. In FIG. 7D, the gate-conductor 552 replaces the dummy gate-conductors 552p in FIG. 5D, and the gate-conductors 552 intersects the p-type active region structure 82p at the channel region of the p-type transitory T2Bp. The gate-conductor 552 in FIG. 7D is conductively connected to the horizontal conducting line 540 through the gate via-connector VG2b. In FIG. 7D, the terminal-conductor 534 in the inverter INV1 is conductively connected to the gate-conductors 551 and 552 in the inverter INV2.

In the layout diagrams of FIG. 5A, FIG. 6A, and FIG. 7A, the inverters INV1, INV2, and INV3 in the timing circuit 180 are implemented in the first area 501, the NOR gate in the timing circuit 180 is implemented in the second area 502. The NOR gate includes two p-type transistors and two n-type transistors. In FIG. 5A, FIG. 6A, and FIG. 7A, the gate-conductor 558 intersects the p-type active region structure 84p and the n-type active region structure 84n correspondingly at the channel regions of the first one of the p-type transistors and the first one of the n-type transistors. The gate-conductor 559 intersects the p-type active region structure 84p and the n-type active region structure 84n correspondingly at the channel regions of the second one of the p-type transistors and the second one of the n-type transistors. The gate via-connector VG8 conductively connects the gate-conductor 558 to a first corresponding horizontal conducting line (not shown in the figure) in the first metal layer MO. In some embodiments, all of the gate-conductor 558 is atop the n-type active region structure 84n in the second area 502. In some embodiments, only a portion of the gate-conductor 558 is atop the n-type active region structure 84n in the second area 502. Similarly, the gate via-connector VG9 conductively connects the gate-conductor 559 to a second corresponding horizontal conducting line (not shown in the figure). In some embodiments, all of the gate-conductor 559 is atop the n-type active region structure 84n in the second area 502. In some embodiments, only a portion of the gate-conductor 559 is atop the n-type active region structure 84n in the second area 502.

In some embodiments, the driving strength of the inverter INV2 in the timing circuit 180 is larger than the driving strength of the NOR gate in the timing circuit 180. In some embodiments, when the inverter INV2 (e.g., the inverter INV2 in FIG. 7A) is formed by the transistors T2p, T2n, T2Bp, and T2Bn and includes two gate-conductors 551 and 552, the ratio of the driving strength of the inverter INV2 to the driving strength of the NOR gate is larger than 1.0. In some embodiments, the ratio of the driving strength of the inverter INV2 to the driving strength of the NOR gate is reversely proportional to the ratio of the output impedance of the inverter INV2 to the output impedance of the NOR gate.

In some embodiments, the clock signals for driving the master-slave flip-flop 100 is provided by the timing circuit 180 in FIG. 1B. In some alternative embodiments, the clock signals for driving the master-slave flip-flop 100 is provided by a timing circuit that is different from the timing circuit 180 in FIG. 1B.

Figure 8A:
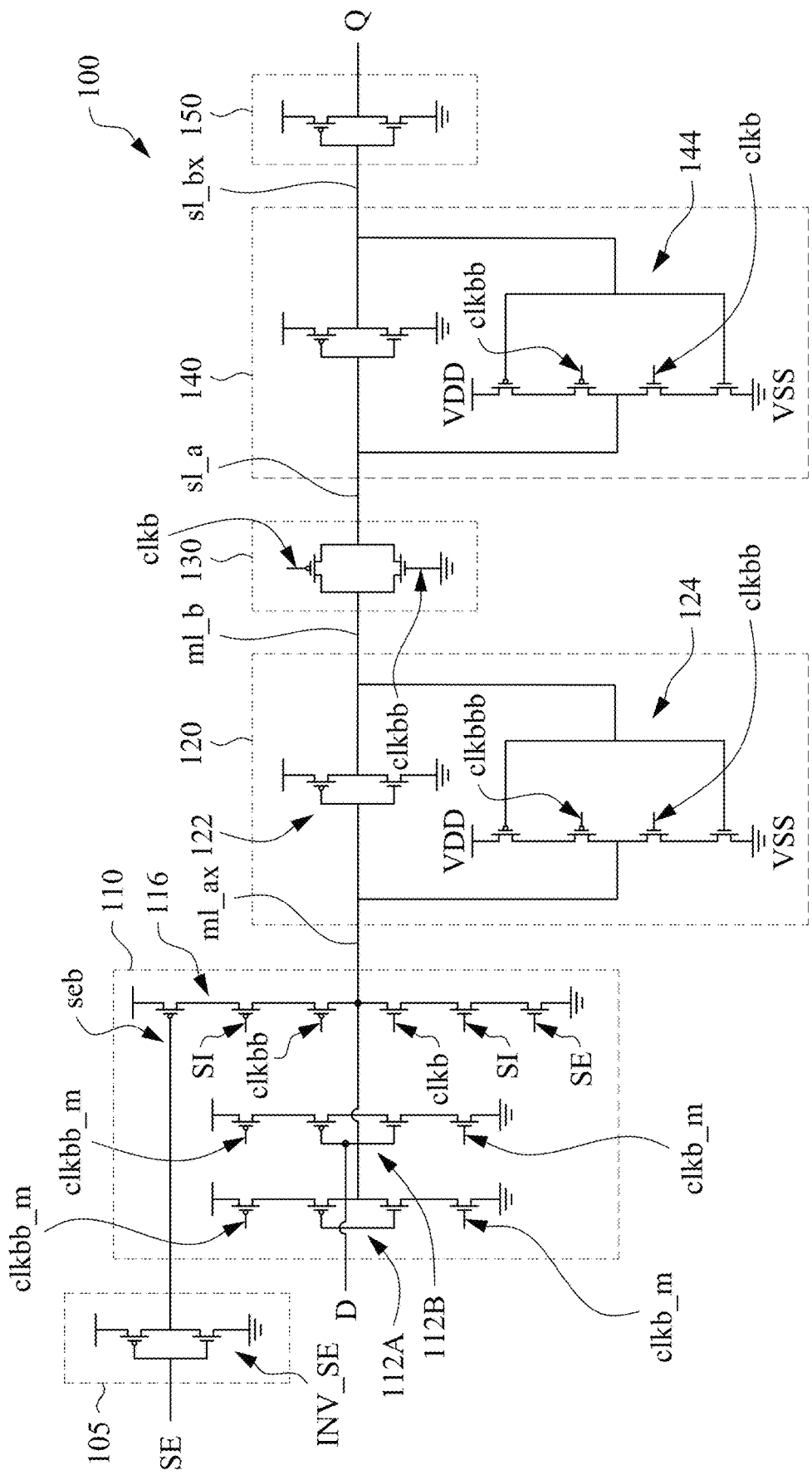
FIGS. 8A-8B are circuit diagrams of the master-slave flip-flop and the timing circuit 880 for providing the clock signals to drive the master-slave flip-flop, in accordance with some embodiments.
Figure 8B:
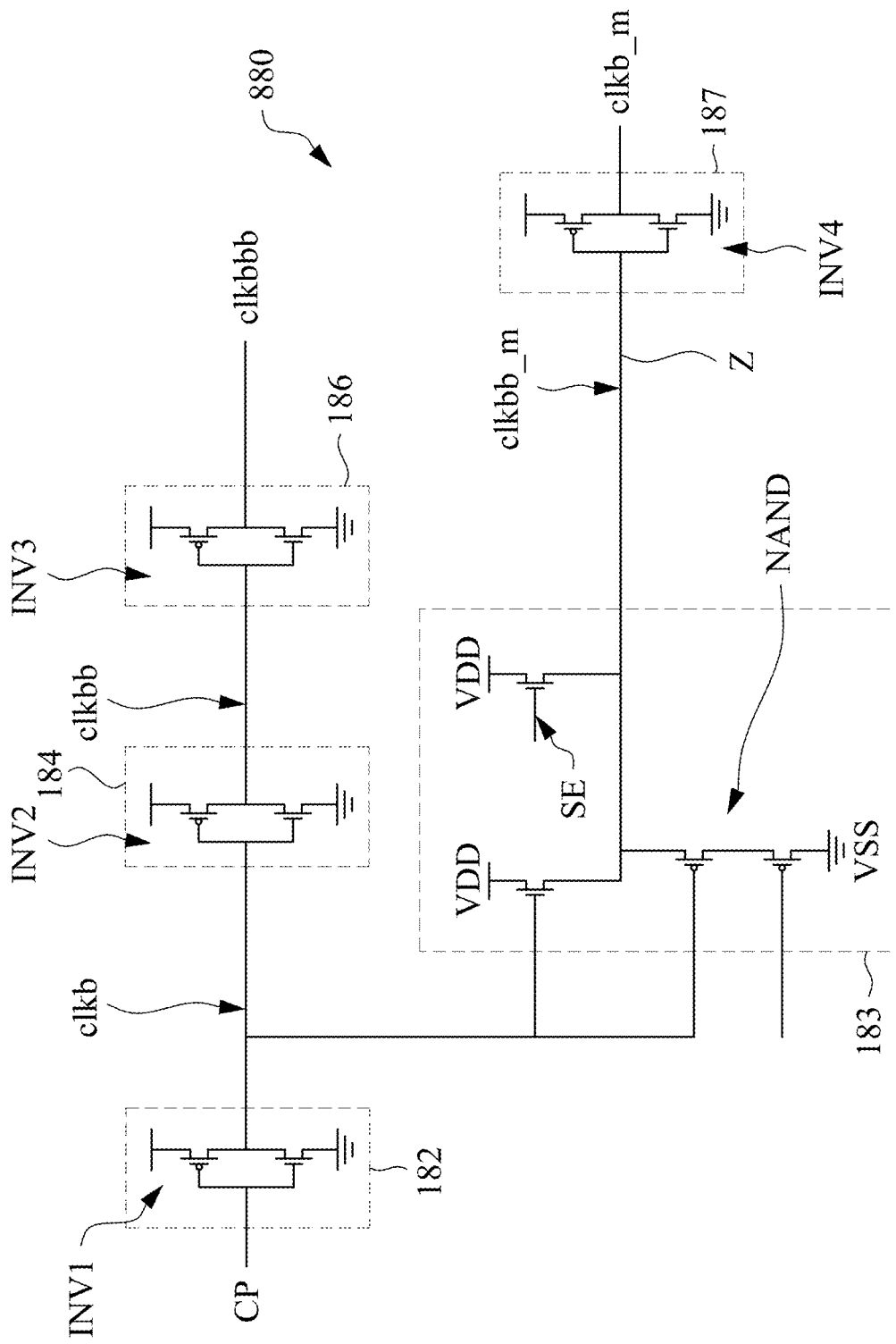

FIGS. 8A-8B are circuit diagrams of the master-slave flip-flop 100 and the timing circuit 880 for providing the clock signals to drive the master-slave flip-flop 100, in accordance with some embodiments. The timing circuit 880 still includes the inverters INV1, INV2, and INV3 in the first area 501 as specified by one of the layout diagrams in FIG. 5A, FIG. 6A, or FIG. 7A. The master-slave flip-flop 100 in FIG. 8A is identical to the master-slave flip-flop 100 in FIG. 4A. The timing circuit 880 in FIG. 8B, however, is a modification of the timing circuit 180 in FIG. 1B. In FIG. 8B, the time delay circuit 183 replaces the time delay circuit 185 of FIG. 1B, and the input terminal of the time delay circuit 183 is directly connected to the output terminal of the time delay circuit 182. In some embodiments, the time delay circuit 183 is implemented as a NAND gate in the second area 502.

Figure 8C:
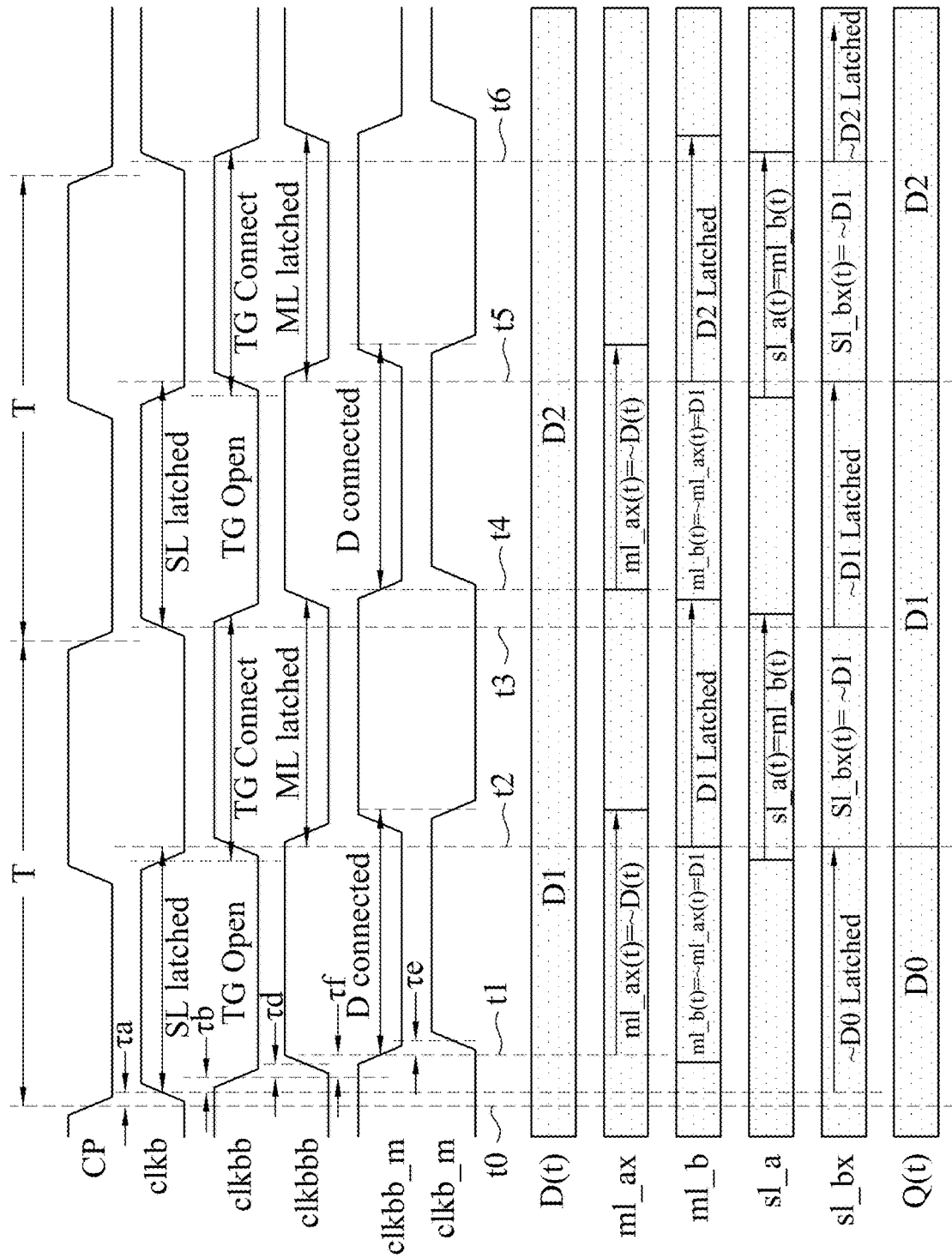
FIG. 8C is a timing diagram of various clock signals in the timing circuit and various data signals in the master-slave flip-flop, in accordance with some embodiments.

FIG. 8C is a timing diagram of various clock signals in the timing circuit 880 and various data signals in the master-slave flip-flop 100, in accordance with some embodiments. While the wave forms of the clock signals clkb_m and clkbb_m in FIG. 8C are different from the wave forms of the clock signals clkb_m and clkbb_m in FIG. 2, the wave forms for other clock signals in FIG. 8C are identical to the corresponding wave forms in FIG. 2. The wave forms for the various data signals in FIG. 8C are also identical to the corresponding wave forms in FIG. 2. In FIG. 8C, the clock signal clkbb_m is delayed from the first clock signal clkb by a time delay $\tau f$, and the clock signal clkb_m is delayed from the clock signal clkbb_m by a time delay $\tau e$. As a comparison, in FIG. 2, the clock signal clkb_m is delayed from the second clock signal clkbb by a time delay $\tau c$, and the clock signal clkb_m is delayed from the clock signal clkb_m by a time delay $\tau e$.

In the timing diagram of FIG. 8C, because the clock signal clkbb and the clock signal clkbb_m are both delayed from the same clock signal clkb, in some embodiments, the delay time $\tau f$ introduced by the NAND gate is made larger than the delay time $\tau b$ introduced by of the inverter INV2 to improve the reliability of the master-slave flip-flop 100. For example, in some embodiments, when the gate via-connector VG2 is atop the p-type active region structure 82p in the first area 501 (as shown in FIG. 5A, FIG. 6A, FIG. 7A), the delay time of the inverter INV2 in the first area 501 is decreased. In some embodiments, when the gate via-connector VG8 and/or the gate via-connector VG9 is atop the n-type active region structure 84n, the delay time of the NAND gate in the second area 502 is increased. In FIG. 8C, when the delay time of introduced by the NAND gate is made larger than the delay time tb introduced by the inverter INV2, the clock signal clkbb_m is delayed from the clock signal clkbb, and the transmission gate 130 is opened (at the falling edge of the clock signal clkbb in FIG. 8C) before the gated input circuit 110 is changed to the connected state (at the falling edge of the clock signal clkbb_m in FIG. 8C). Consequently, signal changes at the input of the gated input circuit 110 during the time interval from the falling edge of the base clock signal CP to the falling edge of the clock signal clkbb do not get propagated to the input node sl_a of the slave latch 140.

The master-slave flip-flop 100 in FIG. 1A, FIG. 3A, FIG. 4A, and FIG. 8A are provided as non-limiting examples. The timing circuit 180 (in FIG. 1B, FIG. 3B, and FIG. 4B) and the timing circuit 880 (in FIG. 8B) are also provided as non-limiting examples. Other implementations of the master-slave flip-flop and/or the timing circuit are within the contemplated scope of present disclosure. Examples of the master-slave flip-flop for use with the timing circuit 180 or 880 include the asynchronous reset D flip-flop, the asynchronous set D flip-flop, and the asynchronous set/reset D flip-flop.

Figure 9A:
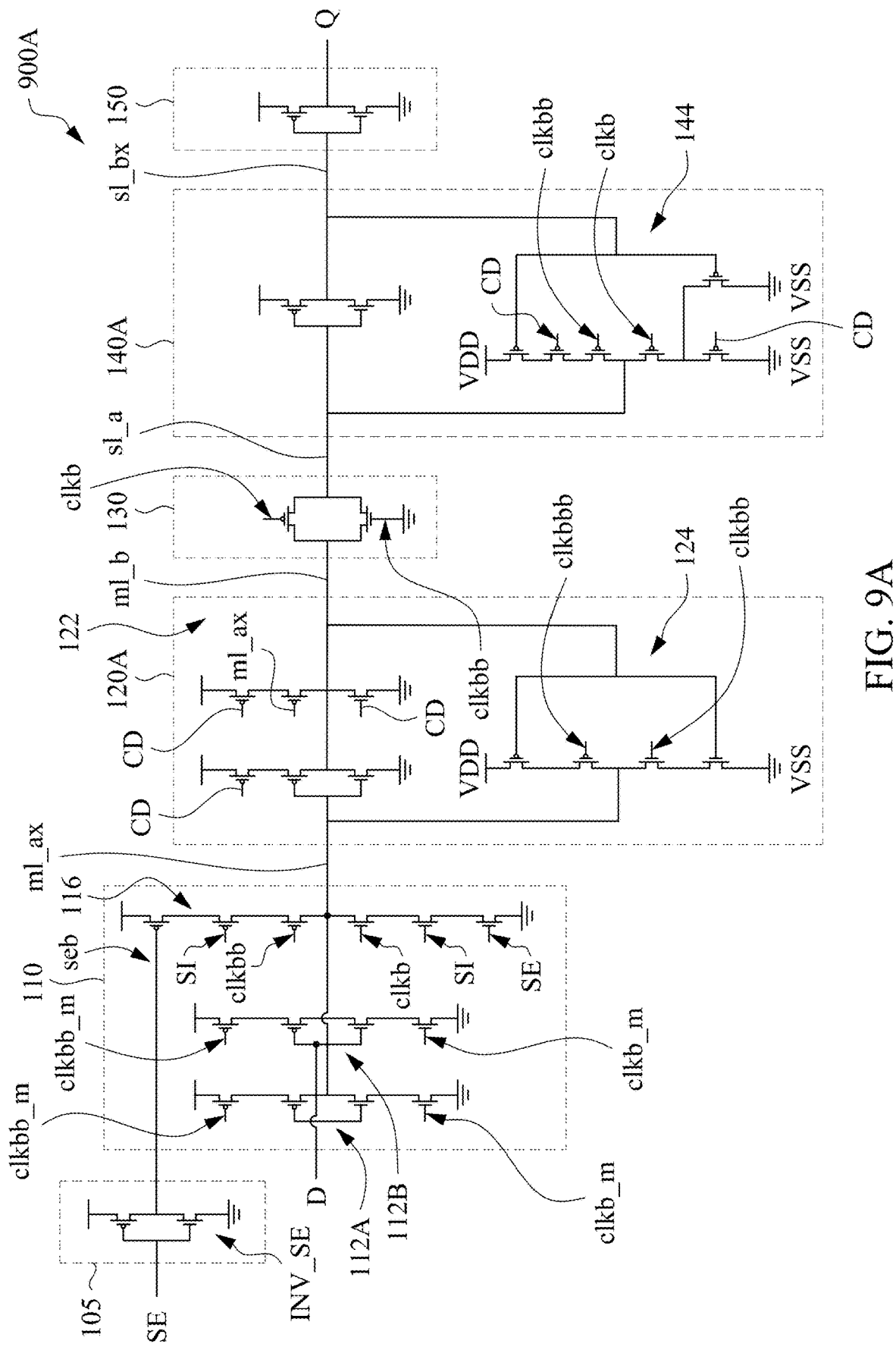
FIGS. 9A-9B are circuit diagrams of the master-slave flip-flop and the timing circuit for providing the clock signals to drive the master-slave flip-flop, in accordance with some embodiments.
Figure 9B:
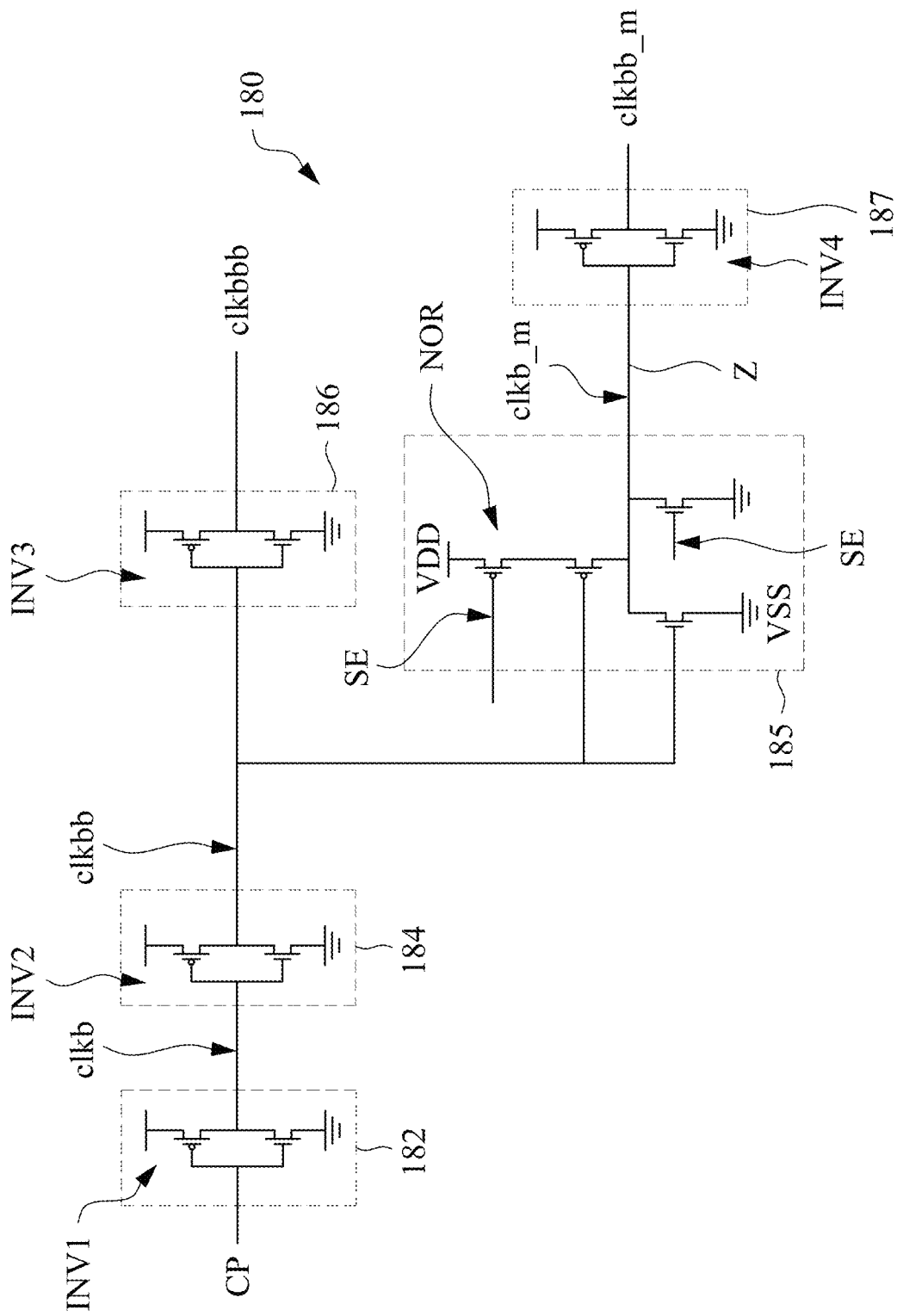

FIGS. 9A-9B are circuit diagrams of the master-slave flip-flop 900A and the timing circuit 180 for providing the clock signals to drive the master-slave flip-flop 900A, in accordance with some embodiments. The circuit diagram of the timing circuit 180 in FIG. 9B is identical to the timing circuit 180 in FIG. 4B. In FIG. 9A, the master-slave flip-flop 900A is an asynchronous reset D flip-flop. Each of the master latch 120A and the slave latch 140A is configured to receive a reset signal CD. During operation, when the reset signal CD is at the logic LOW, each p-type transistor that has the gate terminal receiving the reset signal CD is at the channel conductive state, and each n-type transistor that has the gate terminal receiving the reset signal CD is at the channel opened state. As a consequence, when the reset signal CD is at the logic LOW, the circuit of the master latch 120A in FIG. 9A is equivalent to the circuit of the master latch 120 in FIG. 4A, and the circuit of the slave latch 140A in FIG. 9A is equivalent to the circuit of the slave latch 140 in FIG. 4A. When the reset signal CD is at the logic LOW, the master-slave flip-flop 900A in FIG. 9A operates like the master-slave flip-flop 100 in FIG. 4A.

During operation, when the reset signal CD is at the logic HIGH, each p-type transistor that has the gate terminal receiving the reset signal CD is at the channel opened state, and each n-type transistor that has the gate terminal receiving the reset signal CD is at the channel conductive state. As a consequence, when the reset signal CD is at the logic HIGH, the signal at the output node ml_b of the master latch 120A becomes the logic LOW, the signal at the output node sl_bx of the slave latch 140A becomes the logic HIGH. When the reset signal CD is at the logic HIGH, the signal at the output of the master-slave flip-flop 900A is reset to the logic LOW.

Figure 10A:
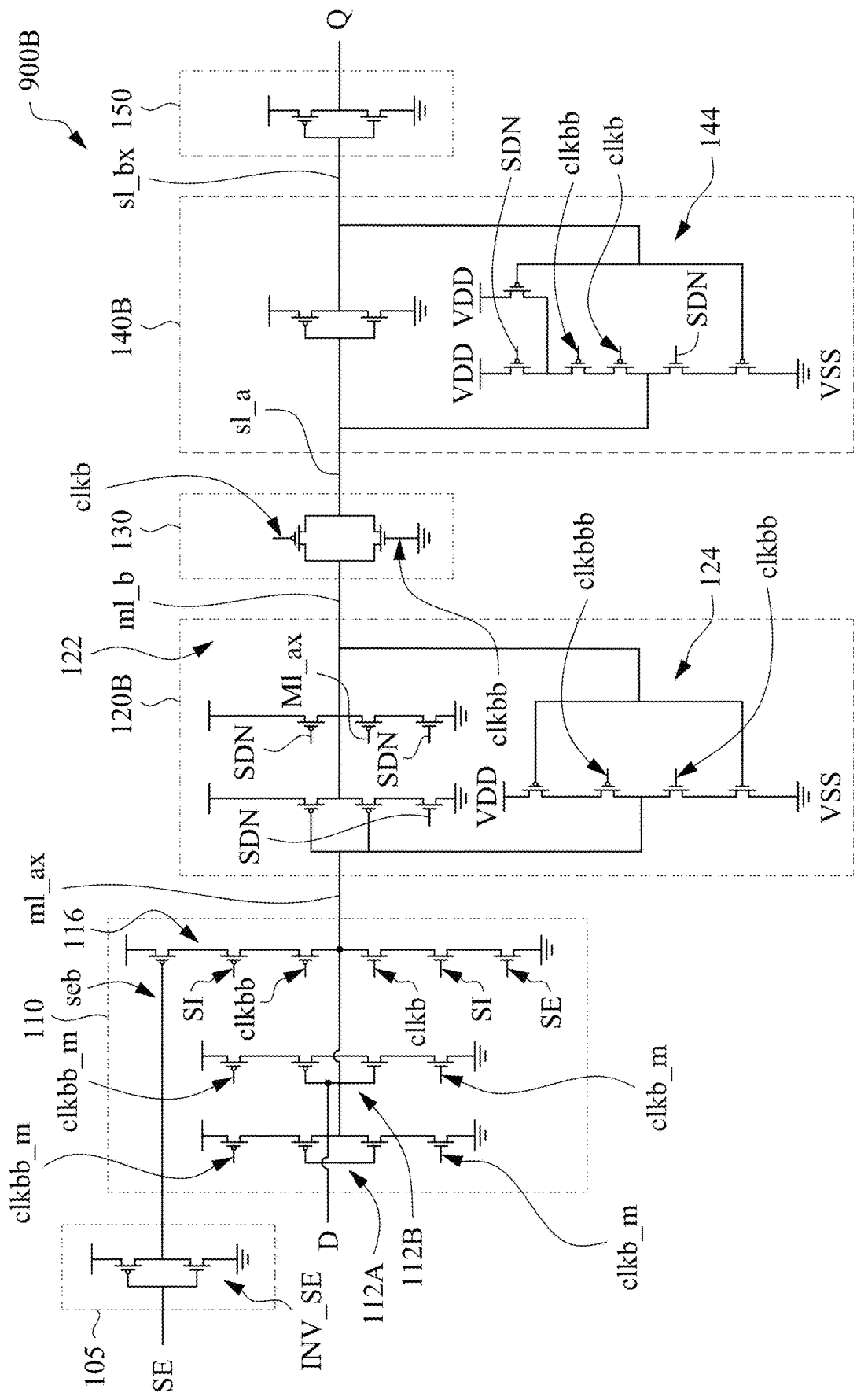
FIGS. 10A-10B are circuit diagrams of the master-slave flip-flop and the timing circuit for providing the clock signals to drive the master-slave flip-flop, in accordance with some embodiments.
Figure 10B:
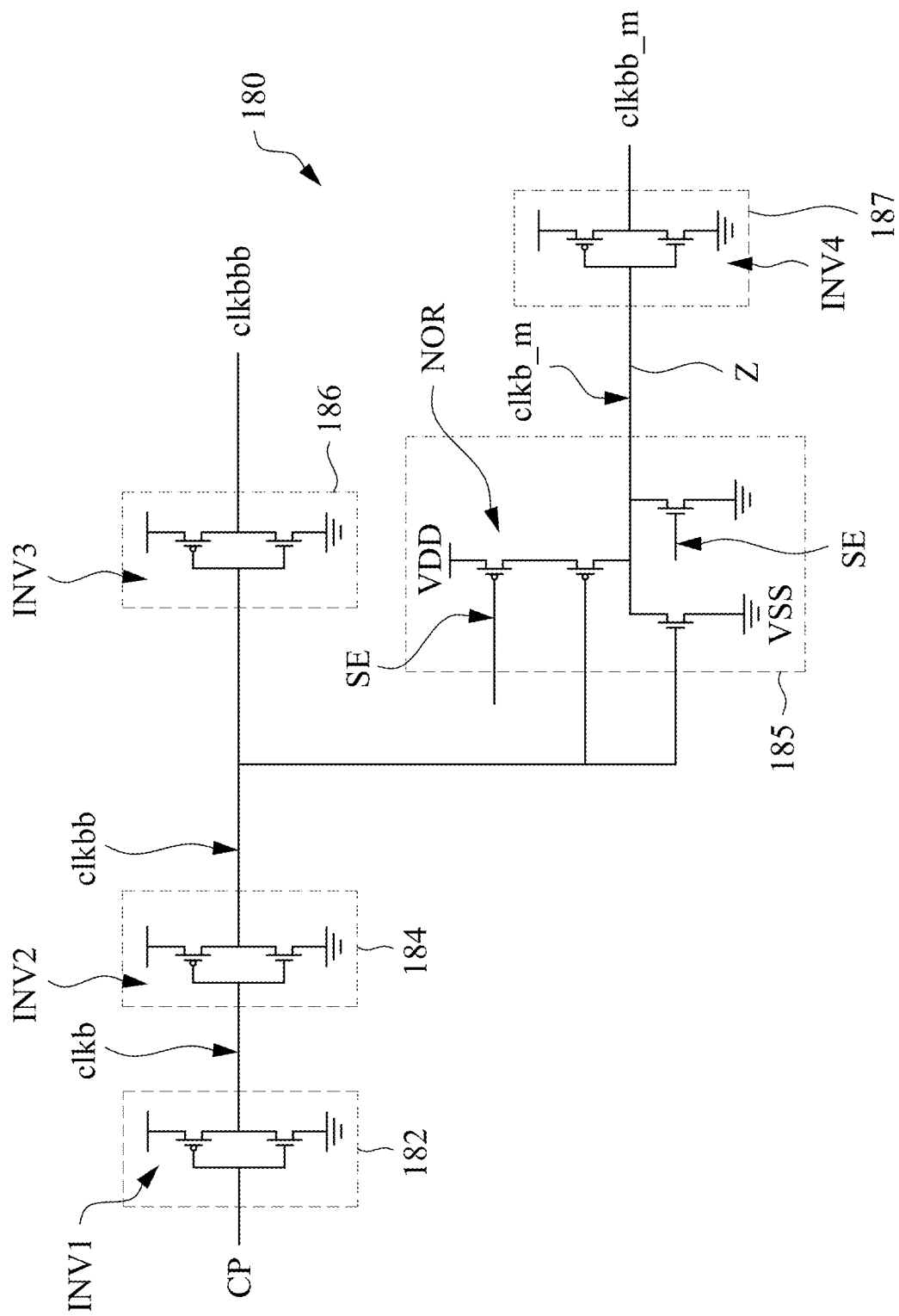

FIGS. 10A-10B are circuit diagrams of the master-slave flip-flop 900B and the timing circuit 180 for providing the clock signals to drive the master-slave flip-flop 900B, in accordance with some embodiments. The circuit diagram of the timing circuit 180 in of FIG. 10B is identical to the timing circuit 180 in FIG. 4B. In FIG. 10A, the master-slave flip-flop 900B is an asynchronous set D flip-flop. Each of the master latch 120B and the slave latch 140B is configured to receive a set signal SDN. During operation, when the set signal SDN is at the logic HIGH, each p-type transistor that has the gate terminal receiving the set signal SDN is at the channel opened state, and each n-type transistor that has the gate terminal receiving the set signal SDN is at the channel conductive state. As a consequence, when the set signal SDN is at the logic HIGH, the circuit of the master latch 120B in FIG. 10A is equivalent to the circuit of the master latch 120 in FIG. 4A, and the circuit of the slave latch 140B in FIG. 10A is equivalent to the circuit of the slave latch 140 in FIG. 4A. When the set signal SDN is at the logic HIGH, the master-slave flip-flop 900B in FIG. 10A operates like the master-slave flip-flop 100 in FIG. 4A.

During operation, when the set signal SDN is at the logic LOW, each p-type transistor that has the gate terminal receiving the set signal SDN is at the channel conductive state, and each n-type transistor that has the gate terminal receiving the set signal SDN is at the channel opened state. As a consequence, when the set signal SDN is at the logic LOW, the signal at the output node ml_b of the master latch 120B becomes the logic HIGH, the signal at the output node sl_bx of the slave latch 140B becomes the logic LOW. When the set signal SDN is at the logic LOW, the signal at the output of the master-slave flip-flop 900B is set to the logic HIGH.

Figure 11A:
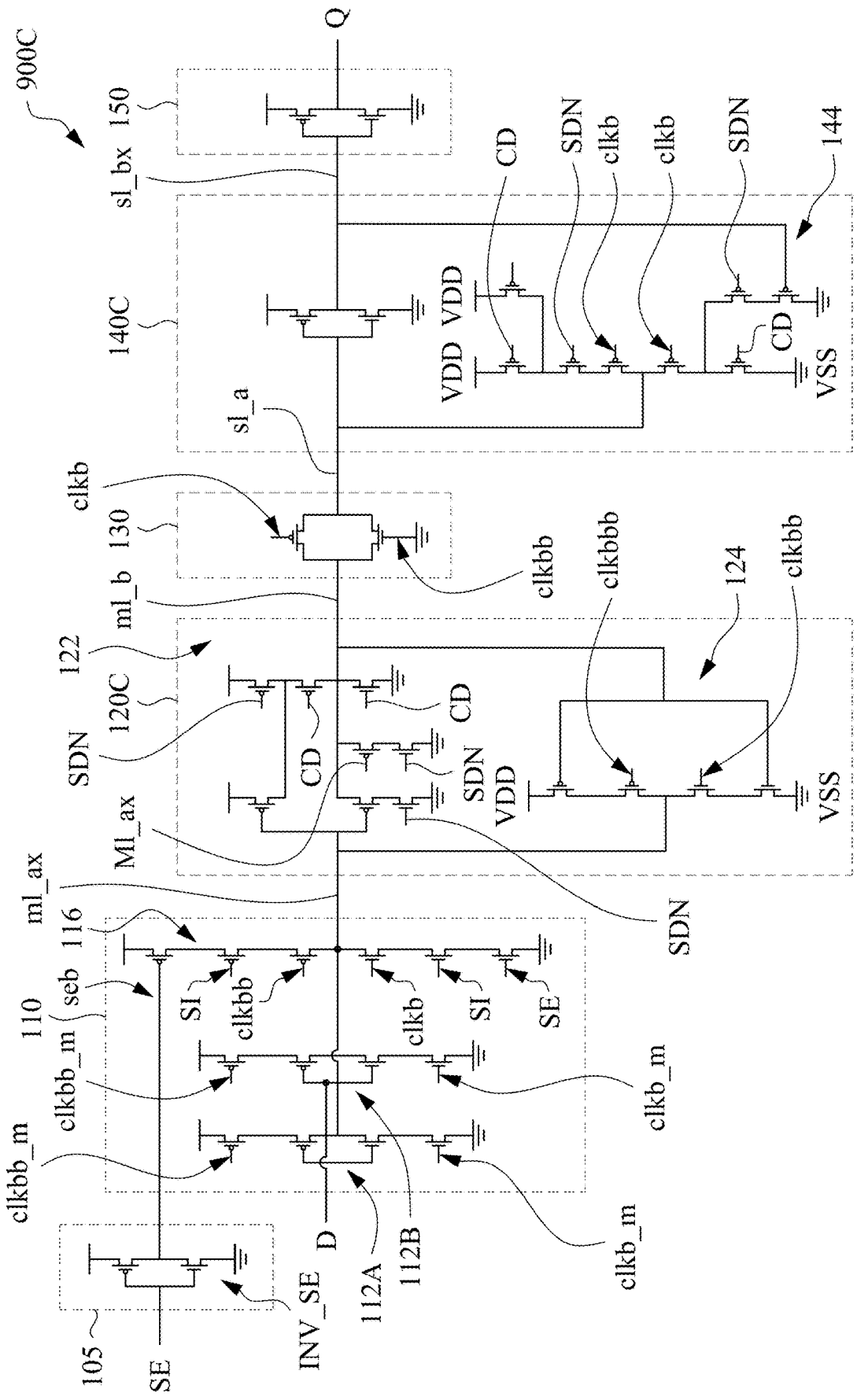
FIGS. 11A-11B are circuit diagrams of the master-slave flip-flop and the timing circuit for providing the clock signals to drive the master-slave flip-flop, in accordance with some embodiments.
Figure 11B:
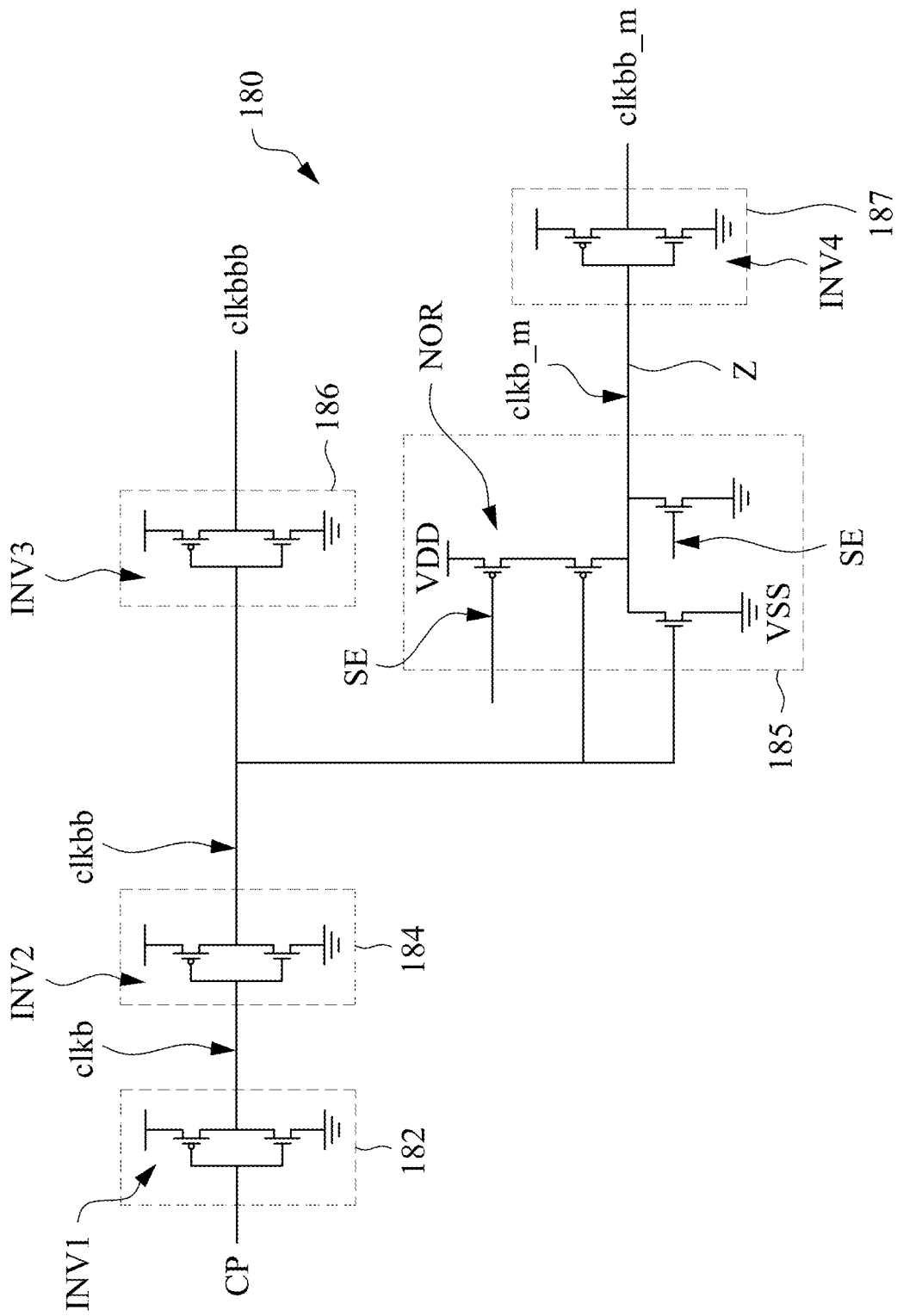

FIGS. 11A-11B are circuit diagrams of the master-slave flip-flop 900C and the timing circuit 180 for providing the clock signals to drive the master-slave flip-flop 900C, in accordance with some embodiments. The circuit diagram of the timing circuit 180 in of FIG. 11B is identical to the timing circuit 180 in FIG. 4B. In FIG. 11A, the master-slave flip-flop 900C is an asynchronous set/reset D flip-flop. Each of the master latch 120C and the slave latch 140C is configured to receive a reset signal CD and a set signal SDN. During operation, when the reset signal CD is at the logic HIGH, each p-type transistor that has the gate terminal receiving the reset signal CD is at the channel opened state, and each n-type transistor that has the gate terminal receiving the reset signal CD is at the channel conductive state. As a consequence, when the reset signal CD is at the logic HIGH, the signal at the output node ml_b of the master latch 120C becomes the logic LOW, the signal at the output node sl_bx of the slave latch 140C becomes the logic HIGH. When the reset signal CD is at the logic HIGH, regardless the logic level of the set signal SDN, the signal at the output of the master-slave flip-flop 900C is reset to the logic LOW.

During operation, when the reset signal CD is at the logic LOW, each p-type transistor that has the gate terminal receiving the reset signal CD is at the channel conductive state, and each n-type transistor that has the gate terminal receiving the reset signal CD is at the channel opened state. As a consequence, when the reset signal CD is at the logic LOW, the operation of the master-slave flip-flop 900C depends upon the logic level of the set signal SDN.

During operation, when the set signal SDN is at the logic LOW, each p-type transistor that has the gate terminal receiving the set signal SDN is at the channel conductive state, and each n-type transistor that has the gate terminal receiving the set signal SDN is at the channel opened state. As a consequence, when the set signal SDN is at the logic LOW while the reset signal CD is at the logic LOW, the signal at the output node ml_b of the master latch 120C becomes the logic HIGH, the signal at the output node sl_bx of the slave latch 140C becomes the logic LOW. When the set signal SDN is at the logic LOW while the reset signal CD is at the logic LOW, the signal at the output of the master-slave flip-flop 900C is set to the logic HIGH.

During operation, when the set signal SDN is at the logic HIGH, each p-type transistor that has the gate terminal receiving the set signal SDN is at the channel opened state, and each n-type transistor that has the gate terminal receiving the set signal SDN is at the channel conductive state. As a consequence, when the set signal SDN is at the logic HIGH while the reset signal CD is at the logic LOW, the circuit of the master latch 120C in FIG. 11A is equivalent to the circuit of the master latch 120 in FIG. 4A, and the circuit of the slave latch 140C in FIG. 11A is equivalent to the circuit of the slave latch 140 in FIG. 4A. When the set signal SDN is at the logic HIGH while the reset signal CD is at the logic LOW, the master-slave flip-flop 900C in FIG. 11A operates like the master-slave flip-flop 100 in FIG. 4A.

Figure 12:
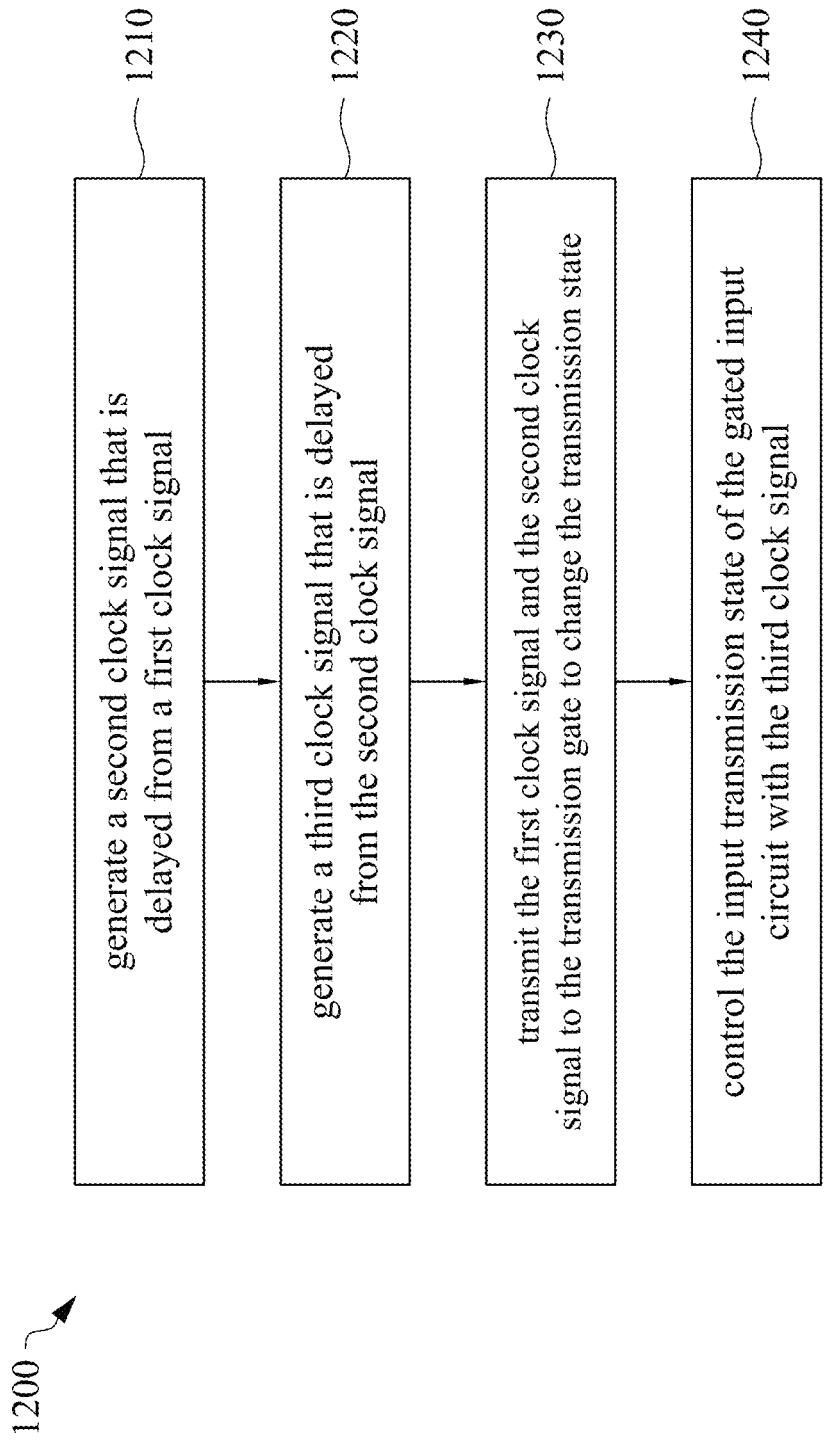
FIG. 12 is a flow chart of a method of operating a master-slave flip-flop, in accordance with some embodiments.

FIG. 12 is a flow chart of a method 1200 of operating a master-slave flip-flop, in accordance with some embodiments. It is understood that additional operations may be performed before, during, and/or after the method 1200 depicted in FIG. 12, and that some other processes may only be briefly described herein. In some embodiments, the circuit diagram of the master-slave flip-flop is shown in FIG. 4A. The master-slave flip-flop 100 in FIG. 4A includes a gated input circuit 110, a master latch 120, a slave latch 140, and a transmission gate 130 coupled between the master latch 120 and the slave latch 140. The master latch 120 is coupled between the gated input circuit 110 and the transmission gate 130.

In operation 1210 of method 1200, a second clock signal delayed from the first clock signal is generated. In the embodiments as shown in FIG. 4B, the first clock signal clkb at the output of the time delay circuit 182 is coupled to the input of the time delay circuit 184, and the second clock signal clkbb is generated at the output of the time delay circuit 184. In some embodiments, as shown in FIG. 2, the second clock signal clkbb is the inverse of the first clock signal clkb and delayed from the first clock signal clkb by a time delay τb.

In operation 1220 of method 1200, a third clock signal is generated from the second clock signal, and the third clock signal is delayed from the second clock signal. In the embodiments as shown in FIG. 4B, the time delay circuit 185 receives the second clock signal clkbb at one input and receives the scan enabling signal SE at another input, and the third clock signal clkb_m is generated at the output of the time delay circuit 185. In some embodiments, as shown in FIG. 2, the third clock signal clkb_m is the inverse of the second clock signal clkbb and delayed from the second clock signal clkbb by a time delay τc.

In operation 1230 of method 1200, the first clock signal and the second clock signal are transmitted to the transmission gate to change a transmission state of the transmission gate. In the embodiments as shown in FIG. 4A, the second clock signal clkbb is coupled to the gate of the n-type transistor in the transmission gate 130, and the first clock signal clkb is coupled to the gate of the p-type transistor in the transmission gate 130. When the clock signal clkbb is at the logic HIGH and/or the first clock signal clkb is at the logic LOW, the transmission state of the transmission gate 130 is at the connected state. When the clock signal clkbb is at the logic LOW and the first clock signal clkb is at the logic HIGH, the transmission state of the transmission gate 130 is at the open state.

In operation 1240 of method 1200, an input transmission state of the gated input circuit is controlled with the third clock signal. In the embodiments as shown in FIG. 4B, the output signal of the time delay circuit 185 is coupled to the input of the time delay circuit 187, and a fourth clock signal clkbb_m is generated from the third clock signal clkb_m. In FIG. 4A, the input transmission state of the gated input circuit 110 is controlled by the clock signals clkb_m and clkbb_m received from the timing circuit 180. When the third clock signal clkb_m is at the logic HIGH and/or the fourth clock signal clkbb_m is at the logic LOW, the input transmission state of the gated input circuit 110 is set to the connected state. When the third clock signal clkb_m is at the logic LOW and the fourth clock signal clkbb_m is at the logic HIGH, the input transmission state of the gated input circuit 110 is set to the open state.

Figure 13:
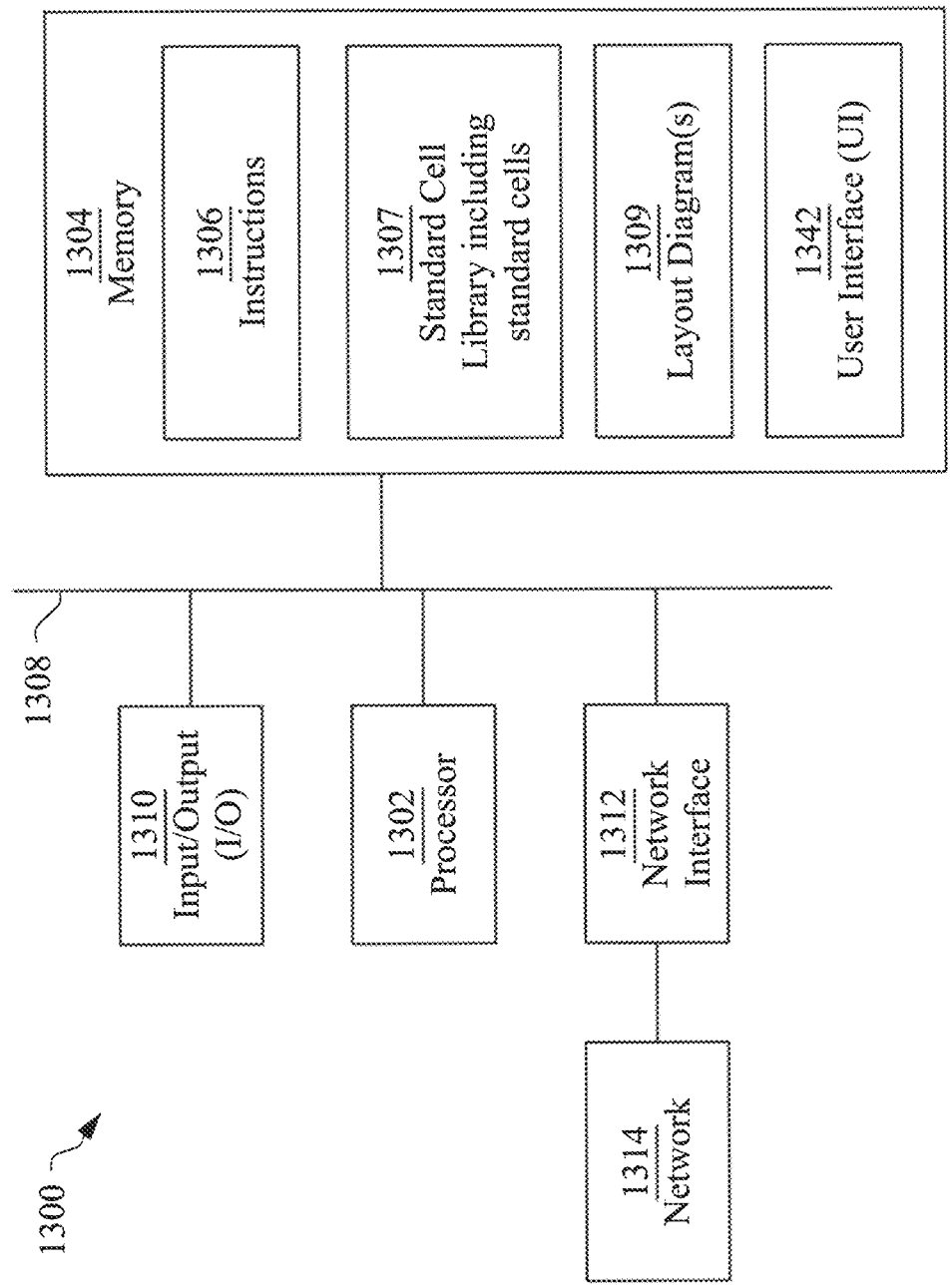
FIG. 13 is a block diagram of an electronic design automation (EDA) system in accordance with some embodiments.

FIG. 13 is a block diagram of an electronic design automation (EDA) system 1300 in accordance with some embodiments.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein. In one or more embodiments, storage medium 1304 stores one or more layout diagrams 1309 corresponding to one or more layouts disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

Figure 14:
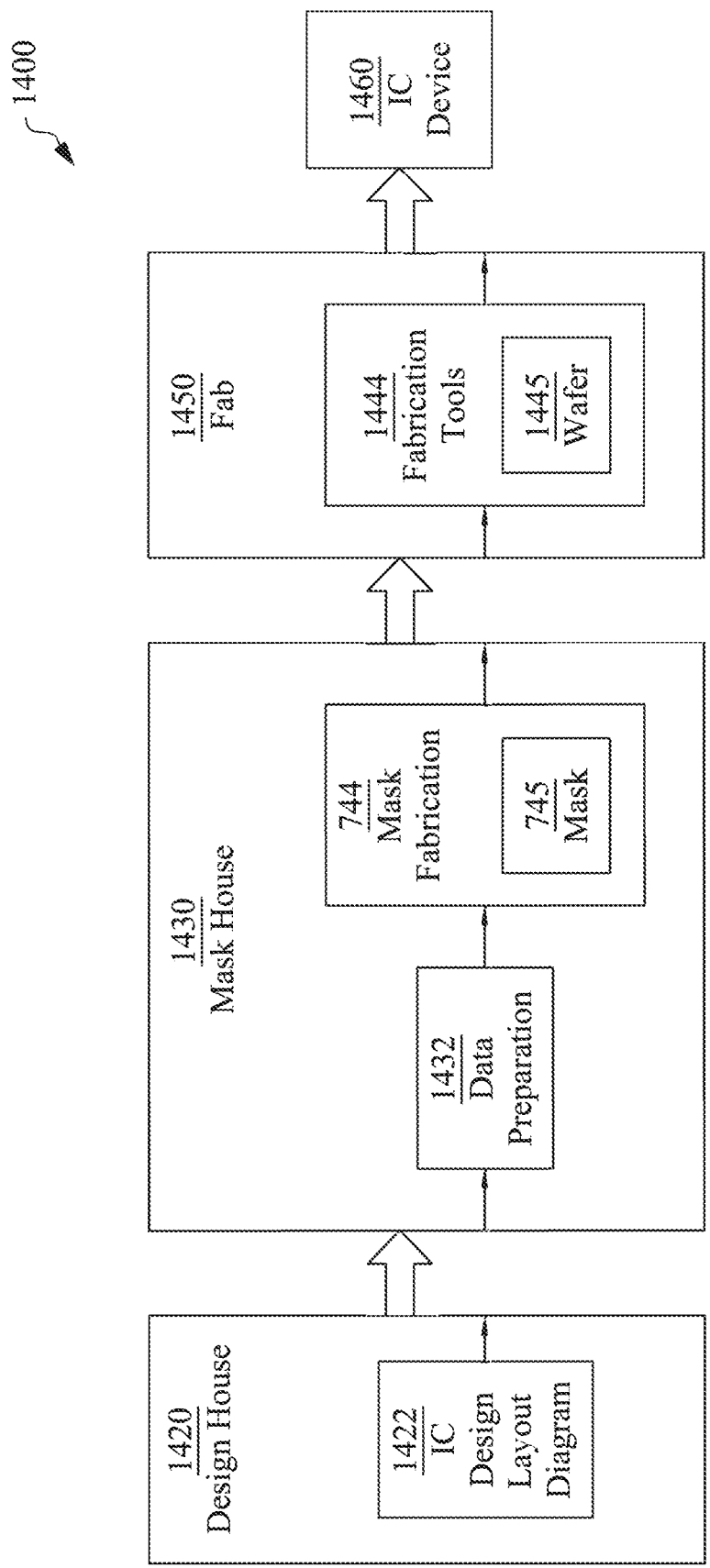
FIG. 14 is a block diagram of an integrated circuit (IC) manufacturing system, and an IC manufacturing flow associated therewith, in accordance with some embodiments.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multilevel interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit includes a first time delay circuit, a second time delay circuit, and a master-slave flip-flop. The first time delay circuit has a first input configured to receive a first clock signal and having a first output configured to generate a second clock signal from the first clock signal. The second time delay circuit has a second input configured to receive the second clock signal and having a second output configured to generate a third clock signal from the second clock signal. The master-slave flip-flop has a gated input circuit, a master latch, a slave latch, and a transmission gate coupled between the master latch and the slave latch. The master latch is coupled between the gated input circuit and the transmission gate. The transmission gate is configured to receive the first clock signal and the second clock signal to control a transmission state of the transmission gate, and the gated input circuit is configured to have an input transmission state controlled by the third clock signal at the second output of the second time delay circuit.

Another aspect of the present disclosure relates to a method of operating a master-slave flip-flop having a master latch coupled between a gated input circuit and a transmission gate. The method includes generating a second clock signal that is delayed from a first clock signal, and generating a third clock signal that is delayed from the second clock signal. The method also includes transmitting the first clock signal and the second clock signal to the transmission gate to change a transmission state of the transmission gate, and controlling an input transmission state of the gated input circuit with the third clock signal.

Still another aspect of the present disclosure relates to an integrated circuit. The integrated circuit includes a first time delay circuit and a second time delay circuit. The first time delay circuit has a first input configured to receive a first clock signal and has a first output configured to generate a second clock signal from the first clock signal. The first time delay circuit further includes a first gate-conductor intersecting a first-type active region structure and a second-type active region structure in a first area. The second time delay circuit has a second input configured to receive the first clock signal and has a second output configured to generate a third clock signal from the first clock signal. The second time delay circuit further includes a second gate-conductor intersecting a first-type active region structure and a second-type active region structure in a second area. The first time delay circuit comprises a first gate via-connector in direct contact with the first gate-conductor atop the first-type active region structure in the first area. The second time delay circuit comprises a second gate via-connector in direct contact with the second gate-conductor atop the second-type active region structure in the second area.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   a first time delay circuit having a first input configured to receive a first clock signal and having a first output configured to generate a second clock signal from the first clock signal;
   a second time delay circuit having a second input configured to receive the second clock signal and having a second output configured to generate a third clock signal from the second clock signal;
   a master-slave flip-flop having a gated input circuit, a master latch, a slave latch, and a transmission gate coupled between the master latch and the slave latch, wherein the master latch is coupled between the gated input circuit and the transmission gate;
   wherein the transmission gate is configured to receive the first clock signal and the second clock signal to control a transmission state of the transmission gate, and the gated input circuit is configured to have an input transmission state controlled by the third clock signal at the second output of the second time delay circuit; and
   wherein the first time delay circuit further includes a first gate-conductor and a first gate via-connector in direct contact with the first gate-conductor, wherein the first gate-conductor intersects a first-type active region structure and a second-type active region structure in a first area, and wherein at least a portion of the first gate via-connector is atop the first-type active region structure.

2. The integrated circuit of claim 1, wherein the second time delay circuit is a NOR gate.

3. The integrated circuit of claim 1, wherein the second time delay circuit further includes a second gate-conductor and a second gate via-connector in direct contact with the second gate-conductor, wherein the second gate-conductor intersects a first-type active region structure and a second-type active region structure in a second area, and wherein at least a portion of the second gate via-connector is atop the second-type active region structure.

4. The integrated circuit of claim 1, wherein a first driving strength of the first time delay circuit is larger than a second driving strength of the second time delay circuit, and wherein the first time delay circuit further includes two gate-conductors, each of the two gate-conductors intersects the first-type active region structure and the second-type active region structure, and each of the two gate-conductors is configured to receive the first clock signal.

5. An integrated circuit comprising:
   a first time delay circuit having a first input configured to receive a first clock signal and having a first output configured to generate a second clock signal from the first clock signal wherein the first time delay circuit further includes two gate-conductors, each of the two gate-conductors intersects a first-type active region structure and a second-type active region structure, and each of the two gate-conductors are configured to receive the first clock signal;
   a second time delay circuit having a second input configured to receive the second clock signal and having a second output configured to generate a third clock signal from the second clock signal;
   a master-slave flip-flop having a gated input circuit, a master latch, a slave latch, and a transmission gate coupled between the master latch and the slave latch, wherein the master latch is coupled between the gated input circuit and the transmission gate;
   wherein the transmission gate is configured to receive the first clock signal and the second clock signal to control a transmission state of the transmission gate, and the gated input circuit is configured to have an input transmission state controlled by the third clock signal at the second output of the second time delay circuit; and
   wherein a first driving strength of the first time delay circuit having the first output coupled to the transmission gate is larger than a second driving strength of the second time delay circuit having the second output coupled to the gated input circuit.

6. The integrated circuit of claim 5, wherein the second time delay circuit is a NOR gate.

7. The integrated circuit of claim 5, wherein the first time delay circuit further includes a first gate-conductor and a first gate via-connector in direct contact with the first gate-conductor, wherein the first gate-conductor intersects the first-type active region structure and the second-type active region structure in a first area, and wherein at least a portion of the first gate via-connector is atop the first-type active region structure.

8. The integrated circuit of claim 5, wherein the second time delay circuit further includes a second gate-conductor and a second gate via-connector in direct contact with the second gate-conductor, wherein the second gate-conductor intersects the first-type active region structure and the second-type active region structure in a second area, and wherein at least a portion of the second gate via-connector is atop the second-type active region structure.

9. The integrated circuit of claim 5, wherein the second-type active region structure in a first area and the second-type active region structure in a second area are separated by the first-type active region structure in the first area and the first-type active region structure in the second area.

10. An integrated circuit comprising:
    a first time delay circuit having a first input configured to receive a first clock signal and having a first output configured to generate a second clock signal from the first clock signal, wherein the first time delay circuit further includes a first gate-conductor intersecting a first-type active region structure and a second-type active region structure in a first area;
    a second time delay circuit having a second input configured to receive the first clock signal and having a second output configured to generate a third clock signal from the first clock signal, wherein the second time delay circuit further includes a second gate-conductor intersecting a first-type active region structure and a second-type active region structure in a second area;
    wherein the first time delay circuit comprises a first gate via-connector in direct contact with the first gate-conductor atop the first-type active region structure in the first area; and
    wherein the second time delay circuit comprises a second gate via-connector in direct contact with the second gate-conductor atop the second-type active region structure in the second area.

11. The integrated circuit of claim 10, wherein the second-type active region structure in the first area and the second-type active region structure in the second area are separated by the first-type active region structure in the first area and the first-type active region structure in the second area.

12. The integrated circuit of claim 10, wherein a portion of the first gate-conductor in the first time delay circuit is atop the first-type active region structure in the first area.

13. The integrated circuit of claim 10, wherein all of the first gate-conductor in the first time delay circuit is atop the first-type active region structure in the first area.

14. The integrated circuit of claim 10, wherein a portion of the second gate-conductor in the second time delay circuit is atop the second-type active region structure in the second area.

15. The integrated circuit of claim 10, wherein all of the second gate-conductor in the second time delay circuit is atop the second-type active region structure in the second area.

16. The integrated circuit of claim 10, further comprising:
a master-slave flip-flop having a master latch, a slave latch, and a transmission gate coupled between the master latch and the slave latch; and
wherein the transmission gate is configured to receive the first clock signal and the second clock signal to control a transmission state of the transmission gate.

17. The integrated circuit of claim 16, wherein the master-slave flip-flop includes a gated input circuit having an input transmission state controlled by the third clock signal at the second output of the second time delay circuit.

18. The integrated circuit of claim 16, further comprising:
a third time delay circuit having a third input configured to receive the third clock signal and having a third output configured to generate a fourth clock signal from the third clock signal; and
a gated input circuit in the master-slave flip-flop configured to receive the third clock signal and the fourth clock signal to control an input transmission state of the gated input circuit.

19. The integrated circuit of claim 10, wherein a first driving strength of the first time delay circuit is larger than a second driving strength of the second time delay circuit.

20. The integrated circuit of claim 10, wherein the first time delay circuit further includes a third gate-conductor intersecting the first-type active region structure and the second-type active region structure in the first area, and wherein each of the first gate-conductor and the third gate-conductor is configured to receive the first clock signal.

* * * * *